US006799976B1

(12) United States Patent
Mok et al.

(10) Patent No.: US 6,799,976 B1
(45) Date of Patent: Oct. 5, 2004

(54) CONSTRUCTION STRUCTURES AND MANUFACTURING PROCESSES FOR INTEGRATED CIRCUIT WAFER PROBE CARD ASSEMBLIES

(75) Inventors: Sammy Mok, Cupertino, CA (US); Fu Chiung Chong, Saratoga, CA (US)

(73) Assignee: NanoNexus, Inc., San Jose, CA (US)

( * ) Notice: Subject to any disclaimer, the term of this patent is extended or adjusted under 35 U.S.C. 154(b) by 221 days.

(21) Appl. No.: 09/980,040

(22) PCT Filed: Jul. 28, 2000

(86) PCT No.: PCT/US00/21012

§ 371 (c)(1),
(2), (4) Date: Nov. 27, 2001

(87) PCT Pub. No.: WO01/09623

PCT Pub. Date: Feb. 8, 2001

Related U.S. Application Data

(60) Provisional application No. 60/146,241, filed on Jul. 28, 1999.

(51) Int. Cl.[7] ............................................. H01R 12/00
(52) U.S. Cl. ....................................................... 439/55
(58) Field of Search ................................ 439/55, 69–71, 439/78, 81, 83, 66, 885–887, 591

(56) References Cited

U.S. PATENT DOCUMENTS

| | | | | |
|---|---|---|---|---|
| 4,764,723 A | * | 8/1988 | Strid | 324/765 |
| 5,152,695 A | | 10/1992 | Grabbe et al. | 439/71 |
| 5,613,861 A | | 3/1997 | Smith et al. | 439/81 |
| 5,764,070 A | * | 6/1998 | Pedder | 324/754 |
| 5,828,226 A | | 10/1998 | Higgins et al. | 324/762 |

FOREIGN PATENT DOCUMENTS

| | | | |
|---|---|---|---|
| EP | 681 186 | 11/1995 | ........... G01R/1/073 |
| EP | 802 419 | 10/1997 | ........... G01R/1/073 |
| FR | 2 518 358 | 10/1981 | ........... H05K/13/08 |
| JP | 3-267763 | * 11/1991 | |
| JP | 5-335746 | * 12/1993 | |
| JP | 11-64386 | * 3/1999 | |
| WO | WO 96/38858 | 12/1996 | |

* cited by examiner

*Primary Examiner*—J. F. Duverne
(74) *Attorney, Agent, or Firm*—Glenn Patent Group; Michael A. Glenn

(57) ABSTRACT

Several embodiments of integrated circuit probe card assemblies are disclosed, which extend the mechanical compliance of both MEMS and thin-film fabricated probes, such that these types of spring probe structures can be used to test one or more integrated circuits on a semiconductor wafer. Several embodiments of probe card assemblies, which provide tight signal pad pitch compliance and/or enable high levels of parallel testing in commercial wafer probing equipment, are disclosed. In some preferred embodiments, the probe card assembly structures include separable standard components, which reduce assembly manufacturing cost and manufacturing time. These structures and assemblies enable high speed testing in wafer form. The probes also have built in mechanical protection for both the integrated circuits and the MEMS or thin film fabricated spring tips and probe layout structures on substrates. Interleaved spring probe tip designs are defined which allow multiple probe contacts on very small integrated circuit pads. The shapes of probe tips are preferably defined to control the depth of probe tip penetration between a probe spring and a pad or trace on an integrated circuit device. Improved protective coating techniques for spring probes are also disclosed, offering increased reliability and extended useful service lives for probe card assemblies.

4 Claims, 27 Drawing Sheets

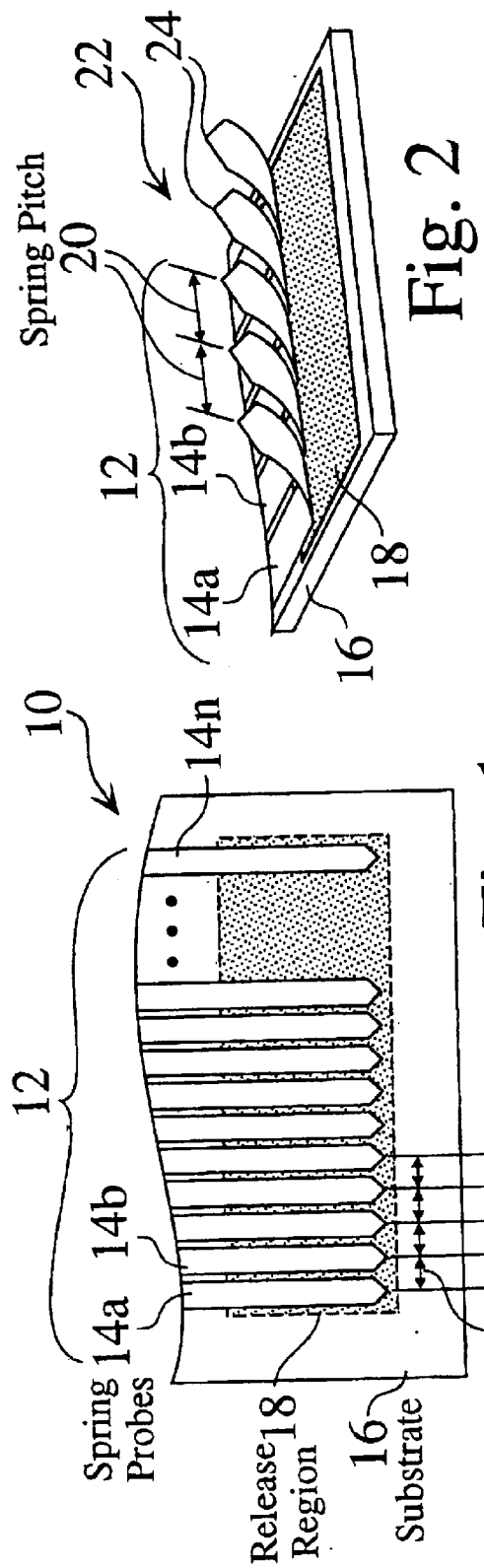
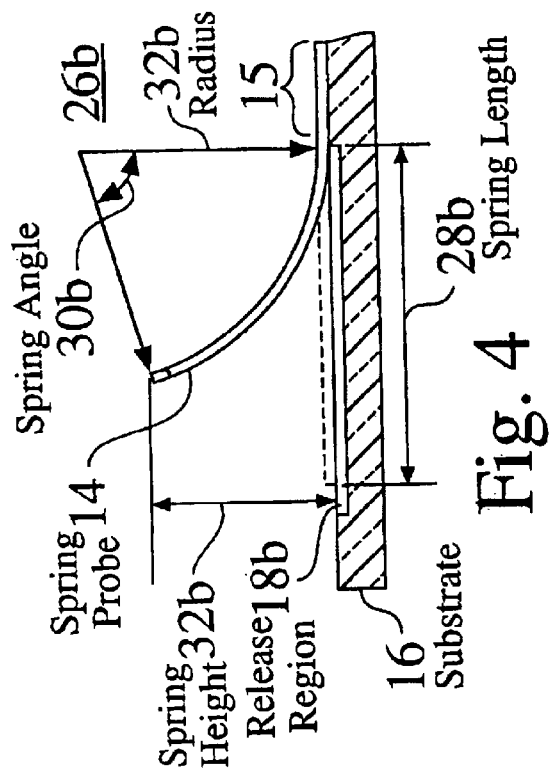
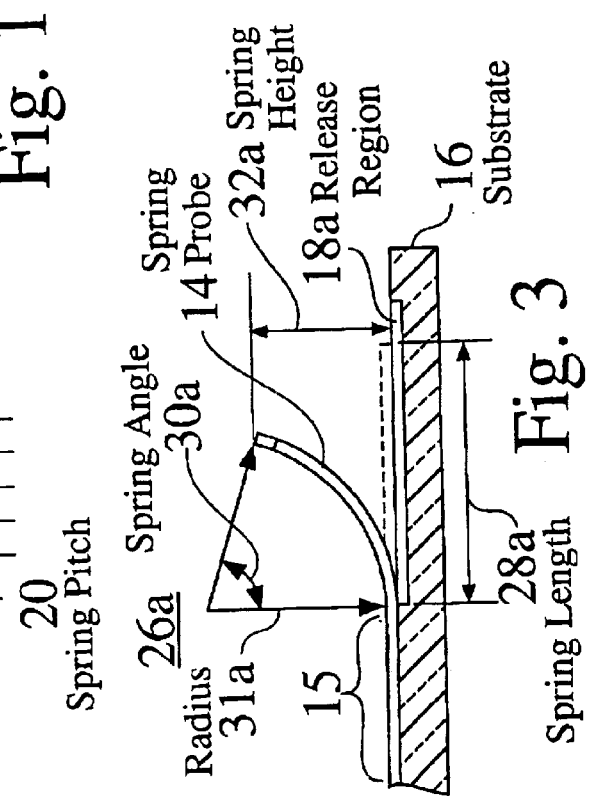

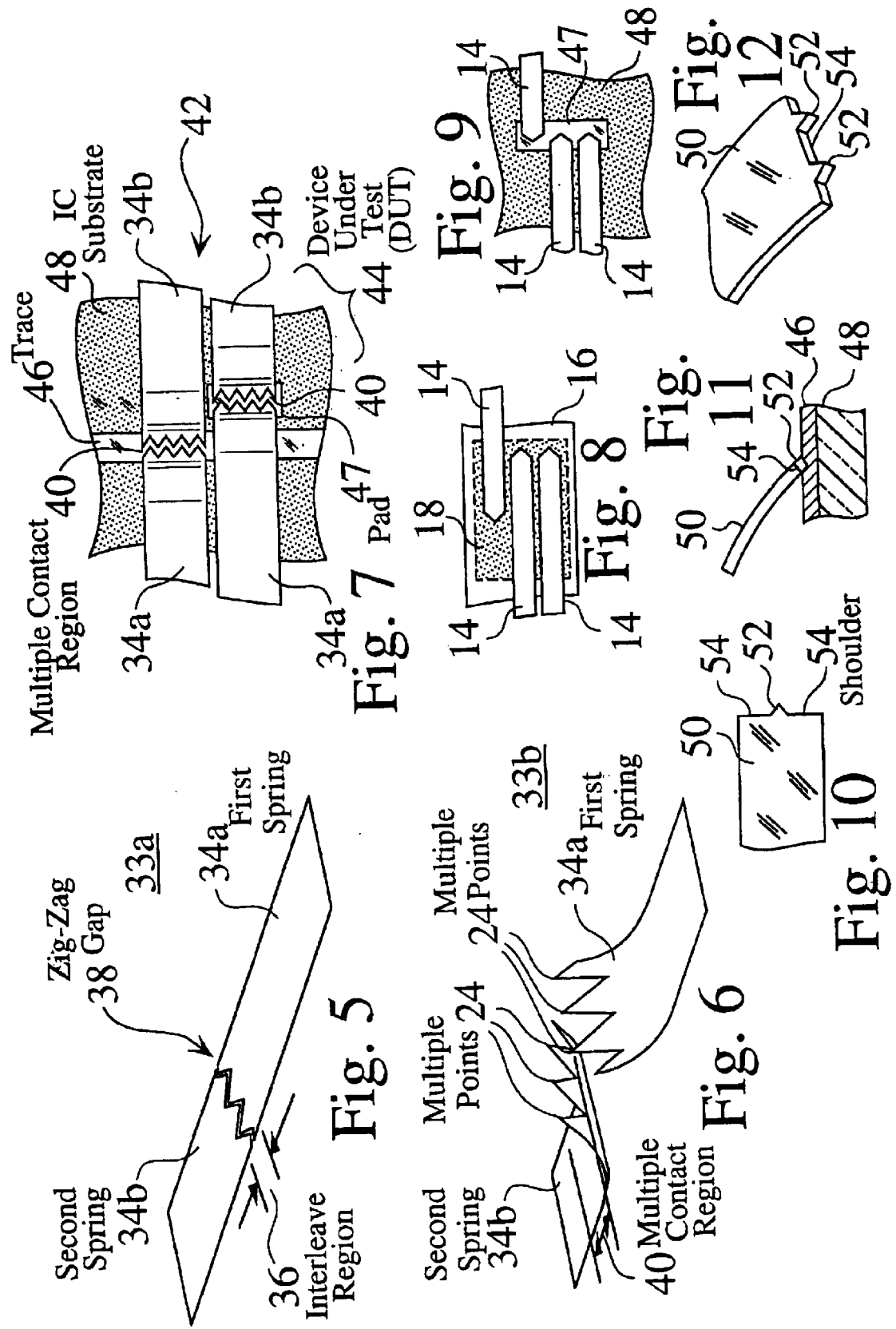

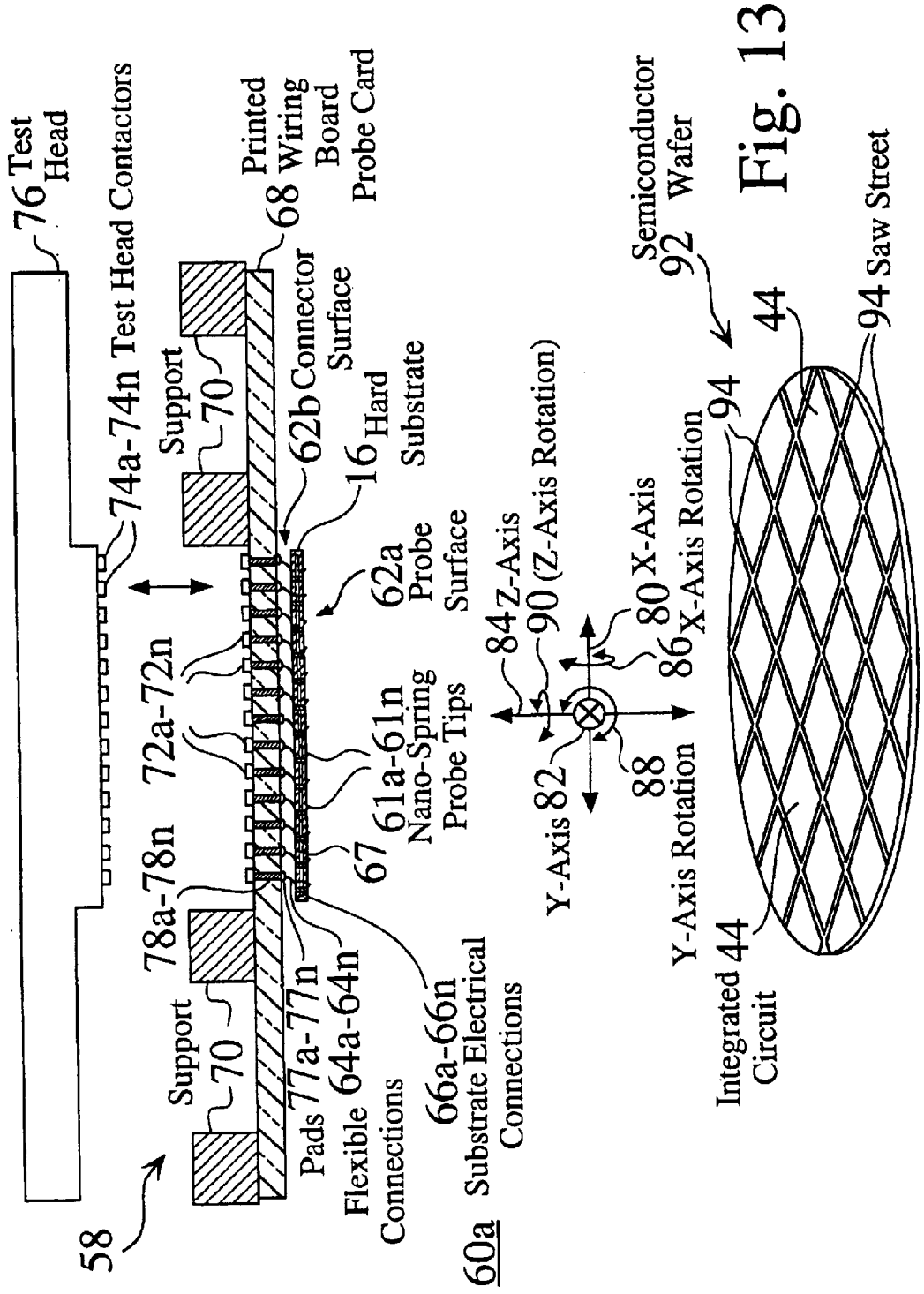

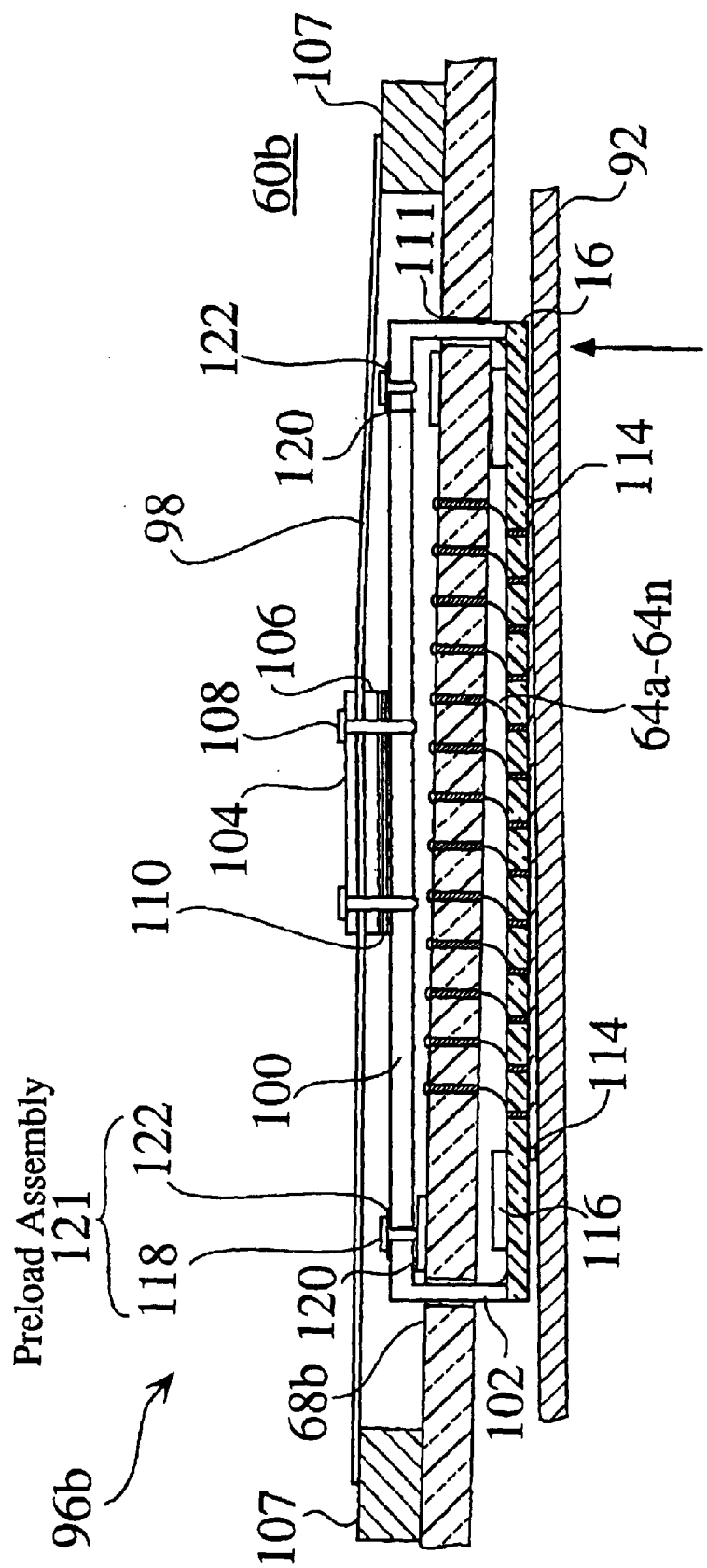
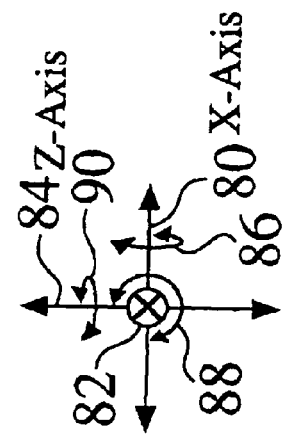
Fig. 16

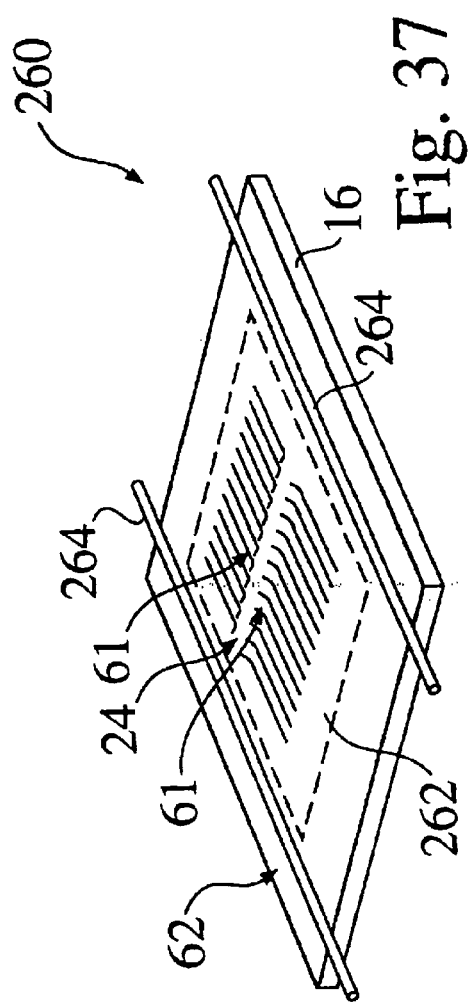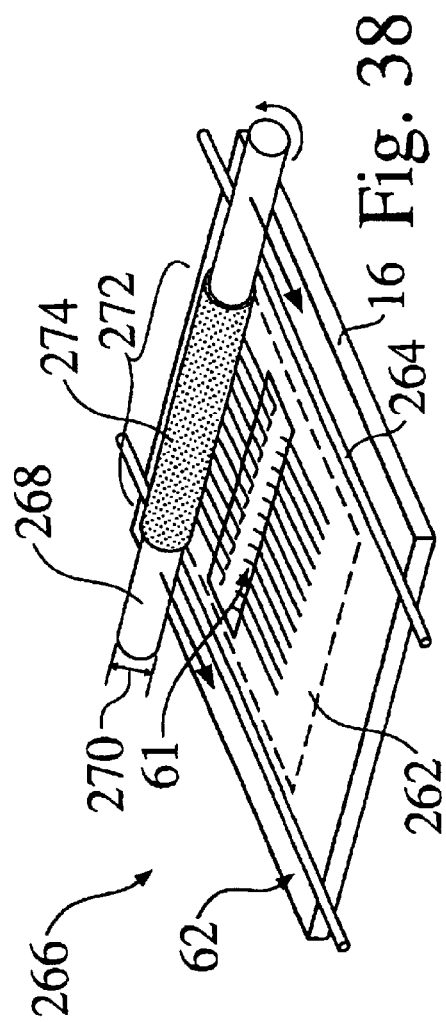

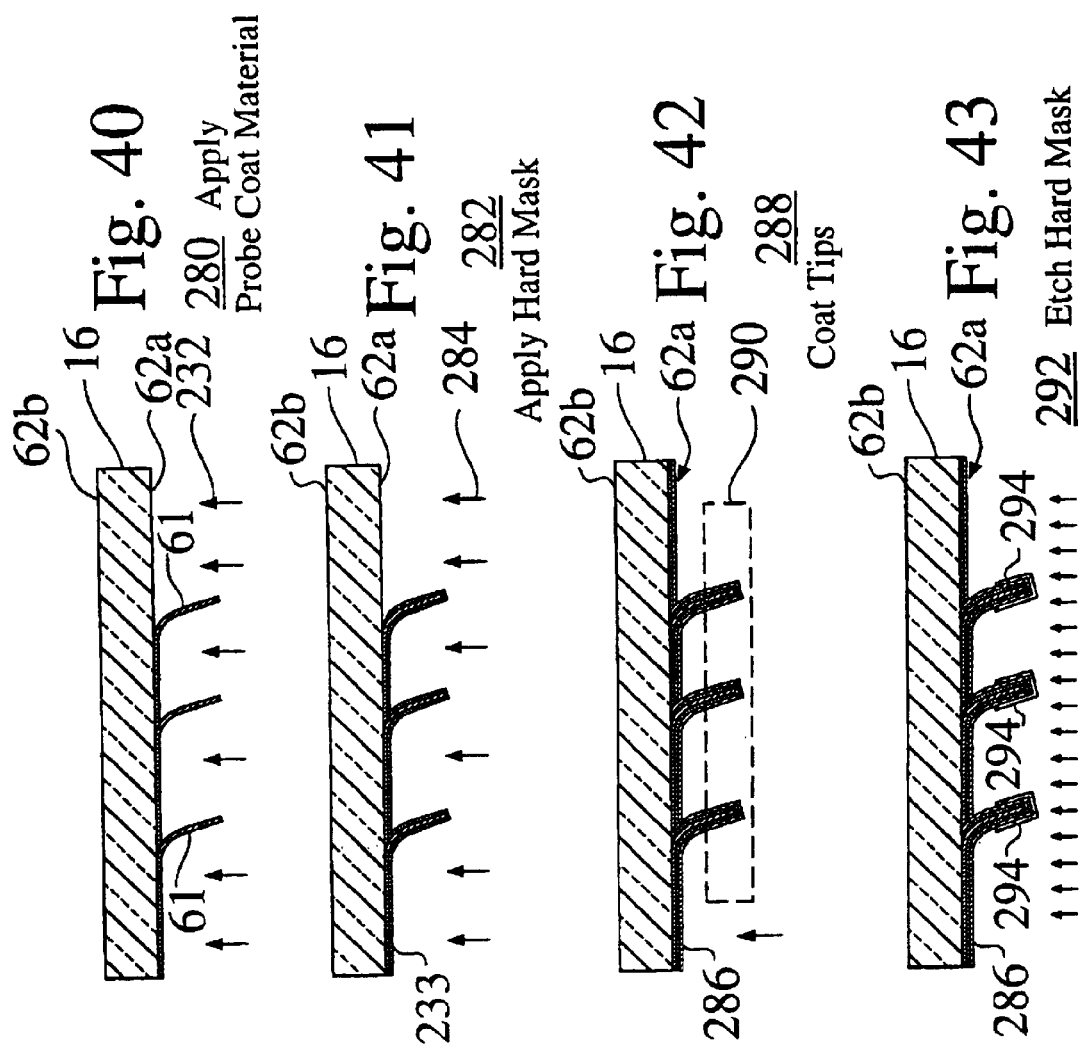

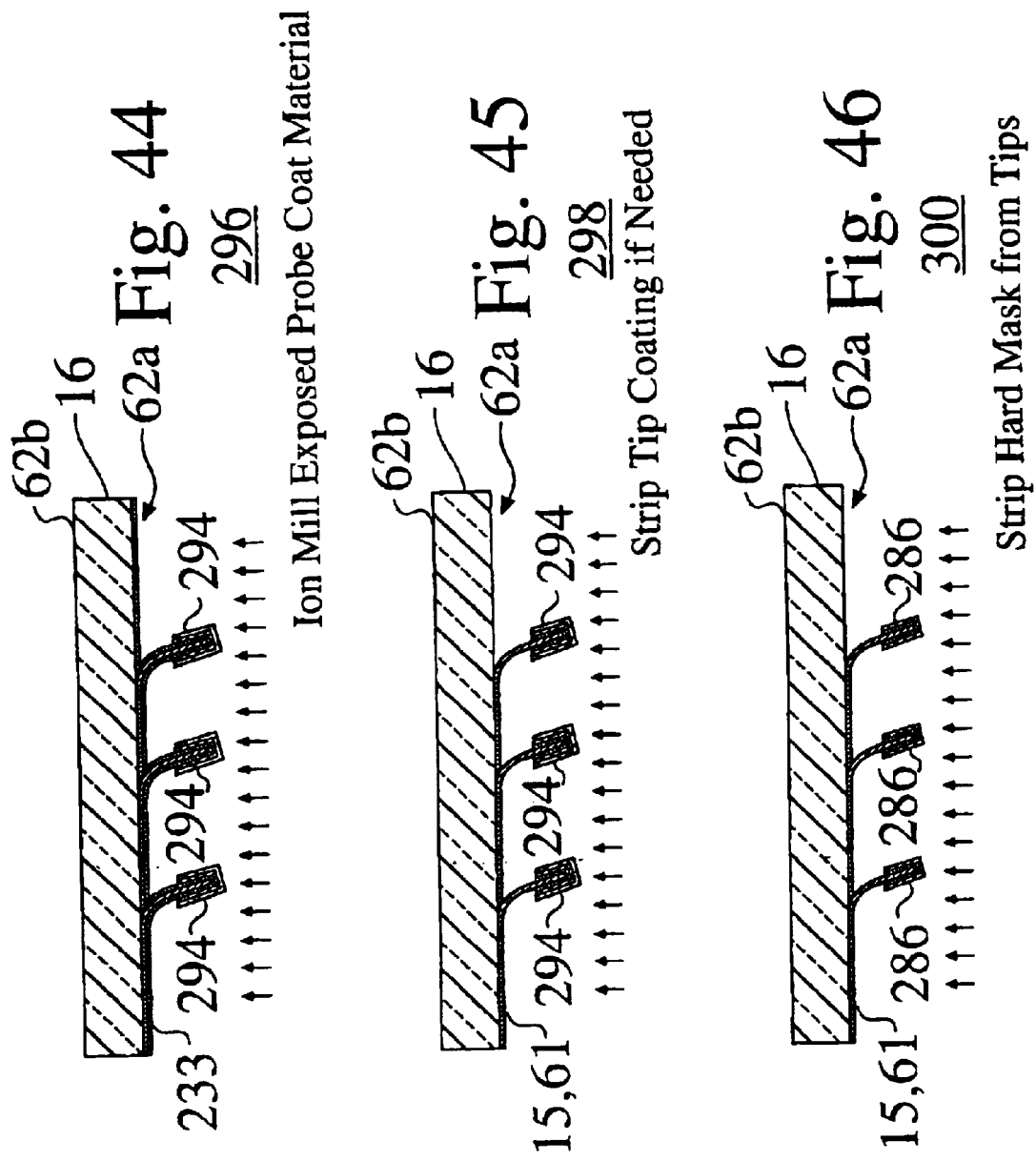

US 6,799,976 B1

CONSTRUCTION STRUCTURES AND MANUFACTURING PROCESSES FOR INTEGRATED CIRCUIT WAFER PROBE CARD ASSEMBLIES

CLAIM FOR PRIORITY

This application claims priority from PCT Internatonal Application Number PCT/US00/21012, filed 28 Jul. 2000, which claims priority from U.S. Provisional Application 60/146,241, filed Jul. 28, 1999.

FIELD OF THE INVENTION

The invention relates to the field of probe card assembly systems. More particularly, the invention relates to improvements in photolithography-patterned spring contacts and enhanced probe card assemblies having photolithography-patterned spring contacts for use in the testing or burn-in of integrated circuits.

BACKGROUND OF THE INVENTION

In conventional integrated circuit (IC) wafer probe cards, electrical contacts between the probe card and an integrated circuit wafer are typically provided by tungsten needle probes. However, advanced semiconductor technologies often require higher pin counts, smaller pad pitches, and higher clock frequencies, which are not possible with tungsten needle probes.

While emerging technologies have provided spring probes for different probing applications, most probes have inherent limitations, such as limited pitch, limited pin count, varying levels of flexibility, limited probe tip geometries, limitations of materials, and high costs of fabrication.

K. Banerji, A. Suppelsa, and W. Mullen III, *Selectively Releasing Conductive Runner and Substrate Assembly Having Non-Planar Areas*, U.S. Pat. No. 5,166,774 (24 Nov. 1992) disclose a runner and substrate assembly which comprises "a plurality of conductive runners adhered to a substrate, a portion of at least some of the conductive runners have non-planar areas with the substrate for selectively releasing the conductive runner from the substrate when subjected to a predetermined stress".

A. Suppelsa, W. Mullen III and G. Urbish, *Selectively Releasing Conductive Runner and Substrate Assembly*, U.S. Pat. No. 5,280,139 (18 Jan. 1994) disclose a runner and substrate assembly which comprises "a plurality of conductive runners adhered to a substrate, a portion of at least some of the conductive runners have a lower adhesion to the substrate for selectively releasing the conductive runner from the substrate when subjected to a predetermined stress".

D. Pedder, *Bare Die Testing*, U.S. Pat. No. 5,786,701 (28 Jul. 1998) disclose a testing apparatus for testing integrated circuits (ICs) at the bare die stage, which includes "a testing station at which microbumps of conductive material are located on interconnection trace terminations of a multilayer interconnection structure, these terminations being distributed in a pattern corresponding to the pattern of contact pads on the die to be tested. To facilitate testing of the die before separation from a wafer using the microbumps, the other connections provided to and from the interconnection structure have a low profile".

D. Grabbe, I. Korsunsky and R. Ringler, *Surface Mount Electrical Connector*, U.S. Pat. No. 5,152,695 (6 Oct. 1992) disclose a connector for electrically connecting a circuit between electronic devices, in which "the connector includes a platform with cantilevered spring arms extending obliquely outwardly therefrom. The spring arms include raised contact surfaces and in one embodiment, the geometry of the arms provide compound wipe during deflection".

H. Iwasaki, H. Matsunaga, and T. Ohkubo, *Partly Replaceable Device for Testing a Multi-Contact Integrated Circuit Chip Package*, U.S. Pat. No. 5,847,572 (8 Dec. 1998) disclose "a test device for testing an integrated circuit (IC) chip having side edge portions each provided with a set of lead pins. The test device comprises a socket base, contact units each including a contact support member and socket contact numbers, and anisotropic conductive sheet assemblies each including an elastic insulation sheet and conductive members. The anisotropic conductive sheet assemblies are arranged to hold each conductive member in contact with one of the socket contact members of the contact units. The test device further comprises a contact retainer detachably mounted on the socket base to bring the socket contact members into contact with the anisotropic sheet assemblies to establish electrical communication between the socket contact members and the conductive members of the anisotropic conductive sheet assemblies. Each of the contact units can be replaced by a new contact unit if the socket contact members partly become fatigued, thereby making it possible to facilitate the maintenance of the test device. Furthermore, the lead pins of the IC chip can be electrically connected to a test circuit board with the shortest paths formed by part of the socket contact members and the conductive members of the anisotropic conductive sheet assemblies".

W. Berg, *Method of Mounting a Substrate Structure to a Circuit Board*, U.S. Pat. No. 4,758,9278 (19 Jul. 1988) discloses "a substrate structure having contact pads is mounted to a circuit board which has pads of conductive material exposed at one main face of the board and has registration features which are in predetermined positions relative to the contact pads of the circuit board. The substrate structure is provided with leads which are electrically connected to the contact pads of the substrate structure and project from the substrate structure in cantilever fashion. A registration element has a plate portion and also has registration features which are distributed about the plate portion and are engageable with the registration features of the circuit board, and when so engaged, maintain the registration element against movement parallel to the general plane of the circuit board. The substrate structure is attached to the plate portion of the registration element so that the leads are in predetermined position relative to the registration features of the circuit board, and in this position of the registration element the leads of the substrate structure overlie the contact pads of the circuit board. A clamp member maintains the leads in electrically conductive pressure contact with the contact pads of the circuit board".

D. Sarma, P. Palanisamy, J. Hearn and D. Schwarz, *Controlled Adhesion Conductor*, U.S. Pat. No. 5,121,298 (9 Jun. 1992) disclose "Compositions useful for printing controllable adhesion conductive patterns on a printed circuit board include finely divided copper powder, a screening agent and a binder. The binder is designed to provide controllable adhesion of the copper layer formed after sintering to the substrate, so that the layer can lift off the substrate in response to thermal stress. Additionally, the binder serves to promote good cohesion between the copper particles to provide good mechanical strength to the copper layer so that it can tolerate lift off without fracture".

R. Mueller, *Thin-Film Electrothermal Device*, U.S. Pat. No. 4,423,401 (27 Dec. 1983) discloses "A thin film multilayer technology is used to build micro-miniature electromechanical switches having low resistance metal-to-metal contacts and distinct on-off characteristics. The switches, which are electrothermally activated, are fabricated on conventional hybrid circuit substrates using processes compatible with those employed to produce thin-film circuits. In a preferred form, such a switch includes a cantilever actuator member comprising a resiliently bendable strip of a hard insulating material (e.g. silicon nitride) to which a metal (e.g. nickel) heating element is bonded. The free end of the cantilever member carries a metal contact, which is moved onto (or out on engagement with an underlying fixed contact by controlled bending of the member via electrical current applied to the heating element".

S. Ibrahim and J. Elsner, *Multi-Layer Ceramic Package*, U.S. Pat. No. 4,320,438 (16 Mar. 1982) disclose "In a multi-layer package, a plurality of ceramic lamina each has a conductive pattern, and there is an internal cavity of the package within which is bonded a chip or a plurality of chips interconnected to form a chip array. The chip or chip array is connected through short wire bonds at varying lamina levels to metallized conductive patterns thereon, each lamina level having a particular conductive pattern. The conductive patterns on the respective lamina layers are interconnected either by tunneled through openings filled with metallized material, or by edge formed metallizations so that the conductive patterns ultimately connect to a number of pads at the undersurface of the ceramic package mounted onto a metalized board. There is achieved a high component density; but because connecting leads are "staggered" or connected at alternating points with wholly different package levels, it is possible to maintain a 10 mil spacing and 10 mil size of the wire bond lands. As a result, there is even greater component density but without interference of wire bonds one with the other, this factor of interference being the previous limiting factor in achieving high component density networks in a multi-layer ceramic package".

F. McQuade, and J. Lander, *Probe Assembly for Testing Integrated Circuits*, U.S. Pat. No. 5,416,429 (16 May 1995) disclose a probe assembly for testing an integrated circuit, which "includes a probe card of insulating material with a central opening, a rectangular frame with a smaller opening attached to the probe card, four separate probe wings each comprising a flexible laminated member having a conductive ground plane sheet, an adhesive dielectric film adhered to the ground plane, and probe wing traces of spring alloy copper on the dielectric film. Each probe wing has a cantilevered leaf spring portion extending into the central opening and terminates in a group of aligned individual probe fingers provided by respective terminating ends of said probe wing traces. The probe fingers have tips disposed substantially along a straight line and are spaced to correspond to the spacing of respective contact pads along the edge of an IC being tested. Four spring clamps each have a cantilevered portion which contact the leaf spring portion of a respective probe wing, so as to provide an adjustable restraint for one of the leaf spring portions. There are four separate spring clamp adjusting means for separately adjusting the pressure restraints exercised by each of the spring clamps on its respective probe wing. The separate spring clamp adjusting means comprise spring biased platforms each attached to the frame member by three screws and spring washers so that the spring clamps may be moved and oriented in any desired direction to achieve alignment of the position of the probe finger tips on each probe wing".

D. Pedder, *Structure for Testing Bare Integrated Circuit Devices*, European Patent Application No. EP 0 731 369 A2 (Filed 14 Feb. 1996), U.S. Pat. No. 5,764,070 (9 Jun. 1998) discloses a test probe structure for making connections to a bare IC or a wafer to be tested, which comprises "a multi-layer printed circuit probe arm which carries at its tip an MCM-D type substrate having a row of microbumps on its underside to make the required connections. The probe arm is supported at a shallow angle to the surface of the device or wafer, and the MCM-D type substrate is formed with the necessary passive components to interface with the device under test. Four such probe arms may be provided, one on each side of the device under test".

B. Eldridge, G. Grube, I. Khandros, and G. Mathieu, *Method of Mounting Resilient Contact Structure to Semiconductor Devices*, U.S. Pat. No. 5,829,128 (3 Nov. 1998), *Method of Making Temporary Connections Between Electronic Components*, U.S. Pat. No. 5,832,601 (10 Nov. 1998), *Method of Making Contact Tip Structures*, U.S. Pat. No. 5,864,946 (2 Feb. 1999), *Mounting Spring Elements on Semiconductor Devices*, U.S. Pat. No. 5,884,398 (23 Mar. 1999), *Method of Burning-In Semiconductor Devices*, U.S. Pat. No. 5,878,486 (9 Mar. 1999), and *Method of Exercising Semiconductor Devices*, U.S. Pat. No. 5,897,326 (27 Apr. 1999), disclose "Resilient contact structures are mounted directly to bond pads on semiconductor dies, prior to the dies being singulated (separated) from a semiconductor wafer. This enables the semiconductor dies to be exercised (e.g. tested and/or burned-in) by connecting to the semiconductor dies with a circuit board or the like having a plurality of terminals disposed on a surface thereof. Subsequently, the semiconductor dies may be singulated from the semiconductor wafer, whereupon the same resilient contact structures can be used to effect interconnections between the semiconductor dies and other electronic components (such a wiring substrates, semiconductor packages, etc.). Using the all-metallic composite interconnection elements of the present invention as the resilient contact structures, burn-in can be performed at temperatures of at least 150° C., and can be completed in less than 60 minutes". While the contact tip structures disclosed by B. Eldridge et al. provide resilient contact structures, the structures are each individually mounted onto bond pads on semiconductor dies, requiring complex and costly fabrication. As well, the contact tip structures are fabricated from wire, which often limits the resulting geometry for the tips of the contacts. Furthermore, such contact tip structures have not been able to meet the needs of small pitch applications (e.g. typically on the order of 50 $\mu$m spacing for a peripheral probe card, or on the order of 75 $\mu$m spacing for an area array).

T. Dozier II, B. Eldridge, G. Grube, I. Khandros, and G. Mathieu, *Sockets for Electronic Components and Methods of Connecting to Electronic Components*, U.S. Pat. No. 5,772,451 (30 Jun. 1998) disclose "Surface-mount, solder-down sockets permit electronic components such as semiconductor packages to be releasably mounted to a circuit board. Resilient contact structures extend from a top surface of a support substrate, and solder-ball (or other suitable) contact structures are disposed on a bottom surface of the support substrate. Composite interconnection elements are used as the resilient contact structures disposed atop the support substrate. In any suitable manner, selected ones of the resilient contact structures atop the support substrate are connected, via the support substrate, to corresponding ones of the contact structures on the bottom surface of the support substrate. In an embodiment intended to receive an LGA-type semiconductor package, pressure contact is made between the resilient contact structures and external connection points of the semiconductor package with a contact force which is generally normal to the top surface of the support substrate. In an embodiment intended to receive a BGA-type semiconductor package, pressure contact is made between the resilient contact structures and external connection points of the semiconductor package with a contact force which is generally parallel to the top surface of the support substrate".

Other emerging technologies have disclosed probe tips on springs which are fabricated in batch mode processes, such as by thin-film or micro electronic mechanical system (MEMS) processes.

D. Smith and S. Alimonda, *Photolithographically Patterned Spring Contact*, U.S. Pat. No. 5,613,861 (25 Mar. 1997), U.S. Pat. No. 5,848,685 (15 Dec. 1998), and International Patent Application No. PCT/US 96/08018 (Filed 30 May 1996), disclose a photolithography patterned spring contact, which is "formed on a substrate and electrically connects contact pads on two devices. The spring contact also compensates for thermal and mechanical variations and other environmental factors. An inherent stress gradient in the spring contact causes a free portion of the spring to bend up and away from the substrate. An anchor portion remains fixed to the substrate and is electrically connected to a first contact pad on the substrate. The spring contact is made of an elastic material and the free portion compliantly contacts a second contact pad, thereby contacting the two contact pads". While the photolithography patterned springs, as disclosed by Smith et al., are capable of satisfying many IC probing needs, the springs are small, and provide little vertical compliance to handle the planarity compliance needed in the reliable operation of many current IC prober systems. Vertical compliance for many probing systems is typically on the order of 0.004"–0.010", which often requires the use of tungsten needle probes.

Furthermore, no one has taught a way to interconnect such a probe containing up to several thousand pins to a tester, while effectively dealing with planarity requirements. As advanced integrated circuit devices become more complex while decreasing in size, it would be advantageous to provide a probe card assembly which can be used to reliably interconnect to such devices.

To accommodate for planarity differences between an array of probe tips and the surface pads on a wafer under test, it may be advantageous to provide a probe substrate which can pivot freely by a small amount about its center. For such a system, however, an accurately controlled force must still be provided to engage the contacts, while holding the substrate positionally stable in the X, Y, and theta directions. Furthermore, for applications in which the substrate includes a large number (e.g. thousands) of wires or signals exiting its backside, wherein supports are located at the periphery of the substrate, these supports must not hinder the fan-out exit pathways. As well, the signal wires must not hinder the pivoting of the substrate, nor should they hinder the controlled force provided to engage the springs against a device under test (DUT).

It would be advantageous to provide a method and apparatus for improved flexible probe springs, which are capable of high pin counts, small pitches, cost-effective fabrication, and customizable spring tips. It would also be advantageous to provide probe card assemblies using such flexible probe springs, which provide planarity compliance to semiconductor devices under testing and/or burn-in, while providing accurate axial and theta positioning.

SUMMARY OF THE INVENTION

Several embodiments of integrated circuit probe card assemblies are disclosed, which extend the mechanical compliance of both MEMS and thin-film fabricated probes, such that these types of spring probe structures can be used to test one or more integrated circuits on a semiconductor wafer. Several embodiments of probe card assemblies are disclosed, which provide tight signal pad pitch and compliance, preferably enabling the parallel testing or burn-in of multiple ICs, using commercial wafer probing equipment. In some preferred embodiments, the probe card assembly structures include separable standard electrical connector components, which reduces assembly manufacturing cost and manufacturing time. These structures and assemblies enable high speed testing of IC's in wafer form, as well as high density substrates. The probes preferably include mechanical protection for both the integrated circuits and the MEMS or thin film fabricated spring tips. Interleaved spring probe tip designs are defined which allow multiple probe contacts on very small integrated circuit pads. The shapes of probe tips are preferably defined to control the depth of probe tip penetration between a probe spring and a pad or trace on an integrated circuit device. Improved protective coating techniques for spring probes are also disclosed, offering increased quality and extended useful service lives for probe card assemblies.

BRIEF DESCRIPTION OF THE DRAWINGS

FIG. 1 is a plan view of a linear array of photolithographically patterned springs, prior to release from a substrate;

FIG. 2 is a perspective view of a linear array of photolithographically patterned springs, after release from a substrate;

FIG. 3 is a side view of a first, short length photolithographically patterned spring, having a first effective radius and height after the short length spring is released from a substrate;

FIG. 4 is a side view of a second, long length photolithographically patterned spring, having a second large effective radius and height after the long length spring is released from a substrate;

FIG. 5 is a perspective view of opposing photolithographic springs, having an interleaved spring tip pattern, before the springs are released from a substrate;

FIG. 6 is a perspective view of opposing photolithographic springs, having an interleaved spring tip pattern, after the springs are released from a substrate;

FIG. 7 is a top view of opposing pairs of interleaved multiple-point photolithographic probe springs, in contact with a single trace on an integrated circuit device;

FIG. 8 is a plan view of opposing single-point photolithographic probe springs, before the springs are released from a substrate;

FIG. 9 is a top view of parallel and opposing single-point photolithographic probe springs, after the springs are released from a substrate, in contact with a single pad on an integrated circuit device;

FIG. 10 is a front view of a shoulder-point photolithographic probe spring;

FIG. 11 is a partial cross-sectional side view of a shoulder-point photolithographic spring in contact with a trace on an integrated circuit device;

FIG. 12 is a perspective view of a multiple shoulder-point photolithographic probe spring;

FIG. 13 is a cross-sectional view of a probe card assembly, wherein a plurality of photolithographic spring probes on a lower surface of a substrate are electrically connected to flexible connections on the upper surface of the substrate, and wherein the flexible connections are connected to a printed wiring board probe card;

FIG. 16 is a second partial cross-sectional view of a bridge and leaf spring suspended probe card assembly in contact with a device under test (DUT);

FIG. 37 is a first perspective view of an alternate probe spring tip coating process;

FIG. 38 is a second perspective view of an alternate probe spring tip coating process;

FIG. 40 is a view of a first step of an alternate spring probe assembly coating process, in which a protective coating is applied to a probe surface of a spring probe assembly;

FIG. 41 is a view of a second optional step of an alternate spring probe assembly coating process, in which a hard mask is applied to a probe surface of a coated spring probe assembly;

FIG. 42 is a view of a third step of an alternate spring probe assembly coating process, in which the probe spring tips of a coated spring probe assembly are controllably coated;

FIG. 43 is a view of an optional fourth step of an alternate spring probe assembly coating process, in which the uncoated portion of the optional hard mask layer is removed;

FIG. 44 is a view of an fifth step of an alternate spring probe assembly coating process, in which the exposed portion of the protective coating layer is removed;

FIG. 45 is a view of an optional sixth step of an alternate spring probe assembly coating process, in which remaining coating layer may be removed from the probe spring tips of the coated spring probe assembly;

FIG. 46 is a view of a seventh step of an alternate spring probe assembly coating process, in which hard mask is stripped from the probe spring tips of the coated spring probe assembly.

DETAILED DESCRIPTION OF PREFERRED EMBODIMENTS

Figure 14:
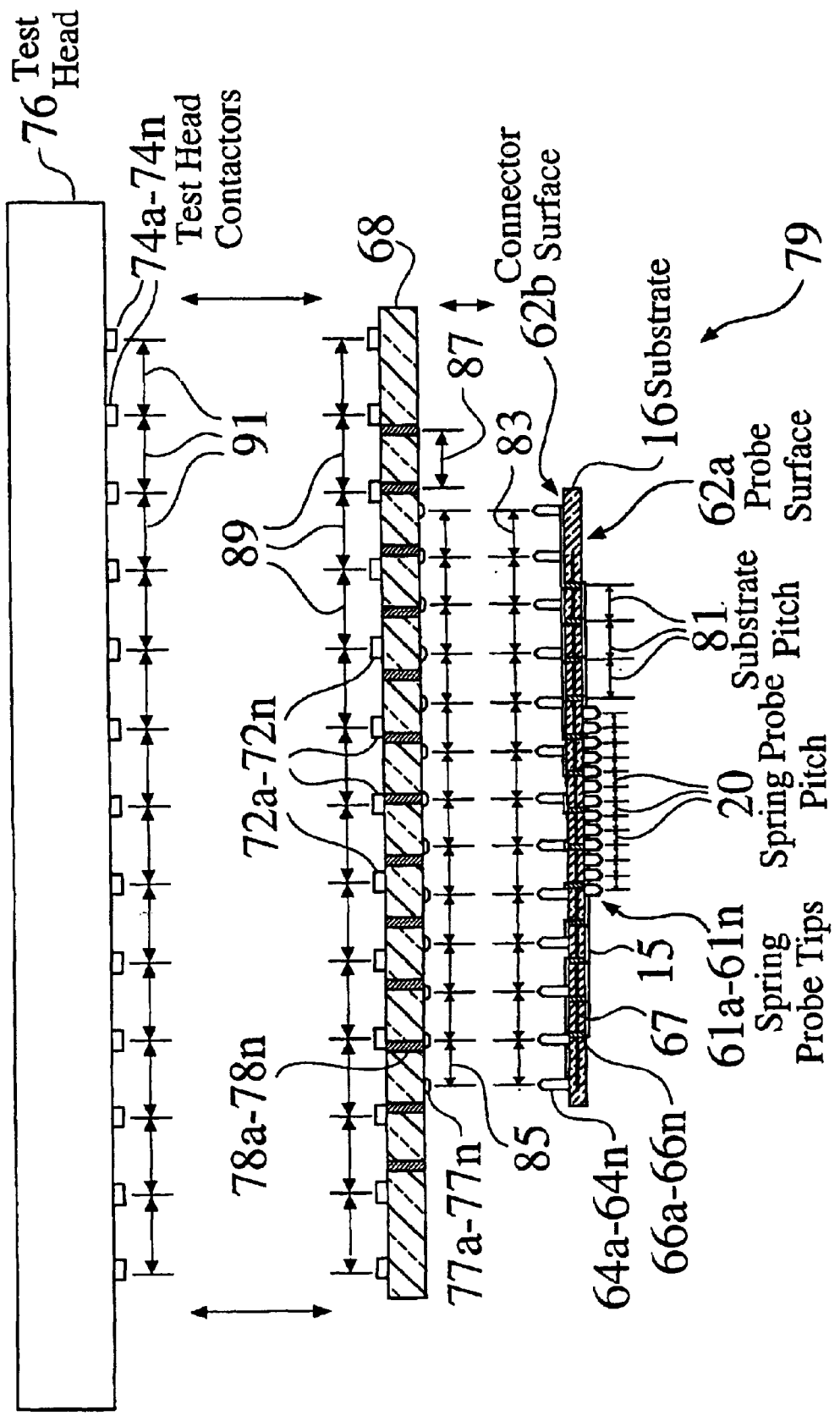
FIG. 14 is a partial expanded cross-sectional view of a probe card assembly, which shows staged pitch and fan-out across a substrate and a printed wiring board probe card.

FIG. 1 is a plan view 10 of a linear array 12 of photo-lithographically patterned springs 14a–14n, prior to release from a substrate 16. The conductive springs 14a–14n are typically formed on the substrate layer 16, by two or more successive layers 17, (e.g. such as 17a, 17b in FIG. 47) of deposited metal, such as through low and high energy plasma deposition processes, followed by photolithographic patterning, as is widely known in the semiconductor industry. The successive layers 17a, 17b have different inherent levels of stress. The release regions 18 of the substrate 16 are then processed by undercut etching, whereby portions of the spring contacts 14a–14n located over the release region 18, are released from the substrate 16 and extend (i.e. bend) away from the substrate 16, as a result of the inherent stresses between the deposited metallic layers 17a, 17b. Fixed regions 15 (FIG. 3, FIG. 4) of the deposited metal traces remain affixed to the substrate 16, and are typically used for routing (i.e. fanning-out) from the spring contacts 14a–14n. FIG. 2 is a perspective view 22 of a linear array 12 of photolithographically patterned springs 14a–14n, after release from a substrate 16. The spring contacts 14a–14n may be formed in high density arrays, with a fine pitch 20, currently on the order of 0.001 inch.

FIG. 3 is a side view 26a of a first photolithographically patterned spring 14 having a short length 28a, which is formed to define a first effective spring angle 30a, spring radius 31a, and spring height 32a, after the patterned spring 14 is released from the release region 18a of the substrate 16, away from the planar anchor region 15. FIG. 4 is a side view 26b of a second photolithographically patterned spring 14, having a long spring length 28b, which is formed to define a second large effective spring angle 30b, spring radius 31b and spring height 32b, after the patterned spring 14 is released from the release region 18b of the substrate 16. The effective geometry of the formed springs 14 is highly customizable, based upon the intended application. As well, the formed springs 14 are typically flexible, which allows them to be used for many applications.

Patterned probe springs 14 are capable of very small spring to spring pitch 20, which allows multiple probe springs 14 to be used to contact power or ground pads on an integrated circuit device 44 (FIG. 13), thereby improving current carrying capability. As well, for a probe card assembly having an array 12 of probe springs 14, multiple probe springs 14 may be used to probe I/O pads on an integrated circuit device 44 under test (DUT), thus allowing every contact 14 to be verified for continuity after engagement of the spring contacts 14 to the wafer 92 under test, thereby ensuring complete electrical contact between a probe card assembly and a device 44, before testing procedures begin.

Improved Structures for Miniature Springs. FIG. 5 is a first perspective view of opposing photolithographic springs 34a,34b, having an interleaved spring tip pattern, before spring release from the substrate 16. FIG. 6 is a perspective view of opposing interleaved photolithographic springs 34a, 34b, after spring to substrate detachment.

The interleaved photolithographic springs 34a, 34b each have a plurality of spring contact points 24. When spring contacts are used for connection to power or ground traces 46 or pads 47 of an integrated circuit device 44, the greatest electrical resistance occurs at the point of contact. Therefore, an interleaved spring contact 34, having a plurality of contact points 24, inherently lowers the resistance between the spring contact 34 and a trace 46 or pad 47. As described above, multiple interleaved probe springs 34 may be used for many applications, such as for high quality electrical connections for an integrated circuit device 44, or for a probe card assembly 60 (FIG. 13), such as for probing an integrated circuit device 44 during testing.

FIG. 7 is a perspective view 42 of opposing interleaved photolithographic spring pairs 34a,34b in contact with single traces 46 on an integrated circuit device under test (DUT) 44. The interleaved spring contact pair 34a and 34b allows both springs 34a and 34b, each having a plurality of contact points 24, to contact the same trace 46. As shown in FIG. 5, when a zig-zag gap 38 is formed between the two springs 34a,34b on a substrate 16, multiple tips 24 are established on each spring 34a,34b. Before the interleaved spring probes 34a,34b are released from the substrate 16, the interleaved points 24 are located within an overlapping interleave region 36. When the interleaved spring probes 34a,34b are detached from the substrate 16, the interleaved spring points 24 remain in close proximity to each other, within a contact region 40, which is defined between the springs 34a, 34b. The interleaved spring contact pair 34a and 34b may then be positioned, such that both interleaved spring probes 34a and 34b contact the same trace 46, such as for a device under test 44, providing increased reliability. As well, since each interleaved spring 34a,34b includes multiple spring points 24, contact with a trace 46 is increased, while the potential for either overheating or current arcing across the multiple contact points 24 is minimized.

FIG. 8 is a top view of parallel and opposing single-point photolithographic springs 14, before the springs 14 are released from a substrate 16. As described above for interleaved springs 34a, 34b, parallel springs 14 may also be placed such that the spring tips 24 of multiple springs contact a single trace 46 on a device 44. As well, opposing spring probes 14 may overlap each other on a substrate 16, such that upon release from the substrate 16 across a release region 18, the spring tips 24 are located in close proximity to each other. FIG. 9 is a top view of parallel and opposing parallel single-point photolithographic springs 14, after the springs 14 are released from the substrate 16, wherein the parallel and opposing parallel single-point photolithographic springs 14 contact a single pad 47 on an integrated circuit device 44.

FIG. 10 is a front view of a shoulder-point photolithographic spring 50, having a point 52 extending from a shoulder 54. FIG. 11 is a partial cross-sectional side view of a shoulder-point photolithographic spring 50, in contact with a trace 46 on an integrated circuit device. FIG. 12 is a perspective view of a multiple shoulder-point photolithographic spring 50. Single point spring probes 14 typically provide good physical contact with conductive traces 46 on an integrated circuit device 22, often by penetrating existing oxide layers on traces 46 or pads 47 by a single, sharp probe tip 24. However, for semiconductor wafers 92 or integrated circuit devices having thin or relatively soft traces 46 or pads 47, a single long probe tip 24 may penetrate beyond the depth of the trace 46, such as into the IC substrate 48, or into other circuitry.

Shoulder-point photolithographic springs 50 therefore include one or more extending points 52, as well as a shoulder 54, wherein the points 52 provide desired penetration to provide good electrical contact to traces 46, while the shoulder 54 prevents the spring 50 from penetrating too deep into a device 44 or wafer 92. Since the geometry of the probe springs 50 are highly controllable by photolithographic screening and etching processes, the detailed geometry of the shoulder-point photolithographic spring 50 is readily achieved.

Improved Probe Card Assemblies. FIG. 13 is a cross-sectional view 58 of a probe card assembly 60a, wherein a plurality of electrically conductive probe tips 61a–61n are located on a lower probe surface 62a of a substrate 16. A plurality of flexible, electrically conductive connections 64a–64n are located on the upper connector surface 62b of the substrate 16, and are each connected to the plurality of electrically conductive springs probe tips 61a–61n, by corresponding electrical connections 66a–66n.

The substrate 16 is typically a solid plate, and is preferably a material having a low thermal coefficient of expansion (TCE), such as ceramic, ceramic glass, glass, or silicon. The electrically conductive spring probe tips 61a–61n establish electrical contact between the probe card assembly 60 and a semiconductor wafer 92, when the probe card assembly 60a and the semiconductor wafer 92 are positioned together.

The spring probe tips 61a–61n may have a variety of tip geometries, such as single point springs 14, interleaved springs 34, or shoulder point springs 50, and are fabricated on the substrate 16, typically using thin-film or MEMS processing methods, to achieve low manufacturing cost, well controlled uniformity, very fine pad pitches 20, and large pin counts.

The probe tips 61a–61n are electrically connected to flexible electric connections 64a–64n, preferably through metalized vias 66a–66n within the substrate 16. Each of the plurality of flexible electric connections 64a–64n are then electrically connected to a printed wiring board probe card 68, which is then typically held in place by a metal ring or frame support structure 70. The preferred metallized via electrical connections 66a–66n (e.g. such as produced by Micro Substrate Corporation, of Tempe, Ariz.), are typically formed by first creating holes in the substrate 16, using laser or other drilling methods. The holes are then filled or plated with conductive material, such as by plating or by extrusion. After the conductive vias 66a–66n are formed, they are typically polished back, to provide a flat and smooth surface.

FIG. 14 is a partial expanded cross-sectional view 79 of a probe card assembly 60a, which shows staged pitch and fan-out across a substrate 16 and a printed wiring board probe card 68. The probe tips 61a–61n are typically arranged on the probe surface 62a of the substrate, with a fine spring pitch 20. The fixed trace portions 15 are then preferably fanned out to the metalized vias 66a–66n, which are typically arranged with a substrate pitch 81. The electrically conductive connections 64a–64n, which are located on the upper connector surface 62b of the substrate 16 and are connected to the vias 66a–66n, are typically arranged with a connection pitch 83, which may be aligned with the substrate pitch 81, or may preferably be fanned out further on the upper connector surface 62b of the substrate 16.

The conductive pads 77a–77n on the underside of the printed wiring board probe card 68 are typically arranged with a pad pitch 85, such that the conductive pads 77a–77n are aligned with the electrically conductive connections 64a–64n located on the upper connector surface 62b of the substrate 16. The conductive pads 77a–77n are then preferably fanned out to conductive paths 78a–78n, which are typically arranged with a probe card pitch 87. The electrically conductive connections 72a–72n, which are located on the upper surface of the printed wiring board probe card 68 and are connected to the conductive paths 78a–78n, are typically arranged with a probe card connection pitch 89, which may be aligned with the probe card pitch 87, or may preferably be fanned out further on the upper surface of the printed wiring board probe card 68. The probe card connection pitch 89 is preferably chosen such that the electrically conductive connections 72a–72n are aligned with the test head connectors 74a–74n located on the test head 76, which are typically arranged with a test head pitch 91.

The flexible electric connections 64a–64n are typically fabricated using a longer spring length 28 than the probe tips 61a–61n, to provide a compliance of approximately 4–10 mils. In some embodiments, the flexible connections 64a–64n are typically built in compliance to photolithographic springs, such as described above, or as disclosed in either U.S. Pat. No. 5,848,685 or U.S. Pat. No. 5,613,861, which are incorporated herein by reference.

The flexible connections 64a–64n are connected to the printed wiring board (PWB) probe card 68, either permanently (e.g. such as by solder or conductive epoxy) or non-permanently (e.g. such as by corresponding metal pads which mate to the tips 24 of flexible connection springs 64a–64n). The printed wiring board probe card 68 then fans out the signals to pads 72a–72n, on a pad pitch 89 suitable for standard pogo pin contactors 74a–74n typically arranged with a test head pitch 91 on a test head 76.

The flexible connections 64a–64n are preferably arranged within an area array, having an array pitch 83 such as 1.00 mm or 1.27 mm, which provides a reasonable density (i.e. probe card pitch 87) for plated through-holes (PTH) 78 on the printed wiring board probe card 68, and allows signal fan-out on multiple layers within the printed wiring board probe card 68, without resorting to advanced printed wiring board probe cards 68 containing blind conductive vias 78a–78n.

The flexible conductive connections 64a–64n, which contact conductive pads 77a–77n on the underside of the printed wiring board probe card 68, maintain electrical connection between the printed wiring board probe card 68 and the substrate 16, while the substrate 16 is allowed to move up and down slightly along the Z-axis 84, as well as tilt about its center. The flexible connections 64a–64n also provide lateral compliance between a substrate 16 and a printed wiring board probe card 68 having different thermal coefficients of expansion (e.g. such as for a low TCE substrate 16 and a relatively high TCE printed wiring board probe card 68).

Alternately, the substrate 16 may be an assembly, such as a membrane probe card, which connects to the printed wiring board probe card 68 through membrane bump contacts 64a–64n. In alternate embodiments of the probe card assembly, connections 64a–64n are provided by a separable connector 132 (FIG. 18), or preferably by a MEG-Array™ connector 162 (FIG. 24), from FCI Electronics, of Etters, Pa., wherein ball grid solder arrays located on opposing halves of the connector 132, 162 are soldered to matching conductive pads on the substrate 16 and printed wiring board probe card 68, and wherein the conductive pads are each arranged within an area array pattern, such that the opposing halves of the connector 132, 162 provide a plurality of mating electrical connections between each of the plurality of spring probe tips 61a–61n and each of the plurality of conductive pads 77a–77n on the underside of the printed wiring board probe card 68.

As the size and design of integrated circuit devices 44 becomes increasingly small and complex, the fine pitch 20 (FIG. 2) provided by miniature spring probe tips 61a–61n becomes increasingly important. Furthermore, with the miniaturization of both integrated circuits 44 and the required probe card test assemblies, differences in planarity between an integrated circuit 44 and a substrate 16 containing a large number of spring probes 61a–61n becomes critical.

The probe card assembly 60a provides electrical interconnections to a substrate 16, which may contain thousands of spring probe tips 61a–61n, while providing adequate mechanical support for the probe card assembly 60a, to work effectively in a typical integrated circuit test probing environment. The probe card assembly 60a is readily used for applications requiring very high pin counts, for tight pitches, or for high frequencies. As well, the probe card assembly 60a is easily adapted to provide electrical contact for all traces 46 (FIG. 7) and input and output pads 47 (FIG. 7, FIG. 9) of an integrated circuit device, for test probe applications which require access to the central region of an integrated circuit die 44.

As shown in FIG. 13, the probe card assembly 60a is typically positioned in relation to an a semiconductor wafer 92, having one or more integrated circuits 44, which are typically separated by saw streets 94. An X-axis 80 and a Y-axis 82 typically defines the location of a probe card assembly 60 across a semiconductor wafer 92 or device 44, while a Z-axis defines the vertical distance between the surface of the wafer 92 and the probe card assembly 60. Position of the wafer 92 under test, in relation to the test head 76 and the probe card assembly 60a is required to be precisely located in relation to the X-axis 80, the Y-Axis 82, and the Z-axis 84, as well as rotational Z-axis (i.e. theta) location 90 about the Z-axis 84.

However, it is increasingly important to allow probe card assemblies to provide contact with a planar semiconductor wafer 92, wherein the semiconductor wafer 92 and the probe card assembly are slightly non-planar to each other, such as by a slight variation in X-axis rotation 86 and/or Y-axis rotation 88.

In the probe card assembly 60a shown in FIG. 13, the probe tips 61a–61n are flexible, which inherently provides planarity compliance between the substrate 16 and the semiconductor wafer 92. As well, the flexible connections 64a–64n, which are also preferably flexible conductive springs 14, 34, 50, provide further planarity compliance between the substrate 16 and the semiconductor wafer 92. The probe card assembly 60a therefore provides planarity compliance between a substrate 16 and an integrated circuit device 44 (i.e. such as by X-axis rotation 86 and/or Y-axis rotation 88). As well, the probe card assembly 60a also accommodates differences in thermal coefficients of expansion (TCE) between the substrate 16 (which is typically comprised of ceramic, ceramic glass, glass, or silicon) and the printed wiring board probe card 68 (which is typically comprised of glass epoxy material).

The signal traces from the probe tips 61a–61n, typically having a small pitch 20, are preferably fanned out to the flexible connections 64a–64n, typically having a larger pitch, using routing traces on one or both surfaces 62a,62b of the substrate 16.

The flexible connections 64a–64n are preferably laid out on a standardized layout pattern, which can match standardized power and ground pad patterns (i.e. assignments) on the printed wiring board probe card 68, thus allowing the same printed wiring board probe card 68 to be used for substrates 16 laid out to mate to different integrated circuit devices 44. As a printed wiring board probe card 68 may be adapted to specialized substrates 16, for the testing of a variety of different devices 44, the operating cost for a printed wiring board probe card 68 is reduced.

To aid in high frequency power decoupling, capacitors 172 (FIG. 24), such as LICA™ series capacitors, from AVX Corporation, of Myrtle Beach S.C., are preferably mounted on the top surface 62b of the substrate 16. Alternately, a parallel plate capacitor may be formed within the substrate 16, between the reference plane and a plane formed on the unused areas of the routing trace layer. For embodiments in which the substrate 16 is composed of silicon, an integral capacitor 67 (e.g. such as an integral bypass capacitor) may preferably be formed between integral diffusion layers processed within the silicon substrate 16.

A look up and look down camera is typically used to align the wafer chuck to the substrate 16, whereby the probe tips 24 are aligned to the contact pads 47 or traces 46 on a device under test 44 located on a semiconductor wafer 92. Alignment is typically achieved, either by looking at spring tips 24, or at alignment marks 185 (FIG. 26) printed on the substrate 16.

For prober setups without such a camera, the substrate 16 is preferably comprised of translucent or transparent material (e.g. such as glass ceramic or glass), thereby allowing view-through-the-top alignment methods to be performed by a test operator. A window 165 (FIG. 24) is preferably defined in the printed wiring board probe card 68, while alignment marks 125 (FIG. 17), 185 (FIG. 26) are preferably located on the substrate and/or the wafer 92 under test. A test operator may then use a camera or microscope to view the alignment marks 125 through the window, and align the substrate 16 and wafer 92.

For applications where access to the surface of the semiconductor wafer 92 is required while probe contact is maintained (e.g. such as for voltage contrast electron beam probing during development of the integrated circuit device 44), a window 123 (FIG. 24) in the substrate region 16 over the IC center is preferably defined, allowing access to observe signals in the die 92. Windows 123 work best for integrated circuit devices 44 having I/O pads located along the die edge, enabling direct probing of integrated circuit devices 44 located on a wafer 92. Currently, the semiconductor wafer dies 92 must be diced first, wherein separate integrated circuit devices 44 are wire bonded into a package, and are then tested.

Defined openings (i.e. windows 123) within the substrate 16 are also preferably used for in-situ e-beam repair of devices such as DRAMs, in which the probe card assembly 60 may remain in place. Testing, repair and retesting may thus be performed at the same station, without moving the wafer 92.

The structure of the probe card assembly 60a provides very short electrical distances between the probe tips 61a–61n and the controlled impedance environment in the printed wiring board probe card 68, which allows the probe card assembly 60a to be used for high frequency applications. For embodiments wherein the traces on one or both surfaces 62a,62b of the substrate 16 are required to be impedance controlled, one or more conductive reference planes may be added within the substrate 16, either on top of the traces, below the traces, or both above and below the traces. For ultra high-frequency applications, the substrate 16 may contain alternating ground reference traces, which are connected to the one or more reference planes 312a, 312b,312c,312d (FIG. 47) at regular intervals using vias 316 (FIG. 47), to effectively provide a shielded coaxial transmission line environment 310.

High Compliance Probe Assemblies. As described above, a probe card assembly structure 60 (e.g. such as 60b in FIG. 15) fixedly supports a substrate 16, relative to the printed wiring board probe card 68, in the lateral X and Y directions, as well as rotationally 90 in relation to the Z axis 84.

While the flexible spring probes 61a–61n, as well as flexible connections 64a–64n, provide some planarity compliance between a probe card assembly 60 and a semiconductor wafer 92 or device 44, other preferred embodiments of the probe card assembly 60 provide enhanced planarity compliance.

Since probe springs 61a–61n are often required to be very small, to provide high density connections and a fine pitch 20, in some probe card applications which require substantial planarity compliance, the compliance provided by the probe springs 61a–61n alone may not be sufficient. Therefore, in some preferred embodiments of the probe card assembly 60, the probe card assembly 60 allows the substrate 16 to pivot about its center (i.e. vary in X-axis rotation 86 and/or Y-axis rotation 88), to provide increased planarity compliance to a semiconductor wafer 92 under test. In such applications, the probe card assembly 60 must still exert a controlled downward force in the Z direction 84, for engaging the probe spring contacts 61a–61n located on the bottom surface 62a of the substrate 16 against a semiconductor wafer 92.

For many embodiments of the probe card assembly 60, the central region 119 (FIG. 17) of the substrate 16 is used for electrical connections 64a–64n between the substrate 16 and the printed wiring board probe card 68, thus requiring that the substrate 16 be supported along the periphery 127 (FIG. 17) of the substrate 16.

A ball joint fulcrum structure may be located within the central region of a probe card assembly on the back side of the substrate support structure, to allow the substrate 16 to pivot about the center, and to provide force to engage the probe tips 61a–61n. However, such a structure would typically impede wire leads or other electrical connections, which often need to exit over the central region of the probe card assembly. Moreover, such a movable joint does not typically restrict theta rotation 90 of the substrate 16 reliably.

Figure 15:
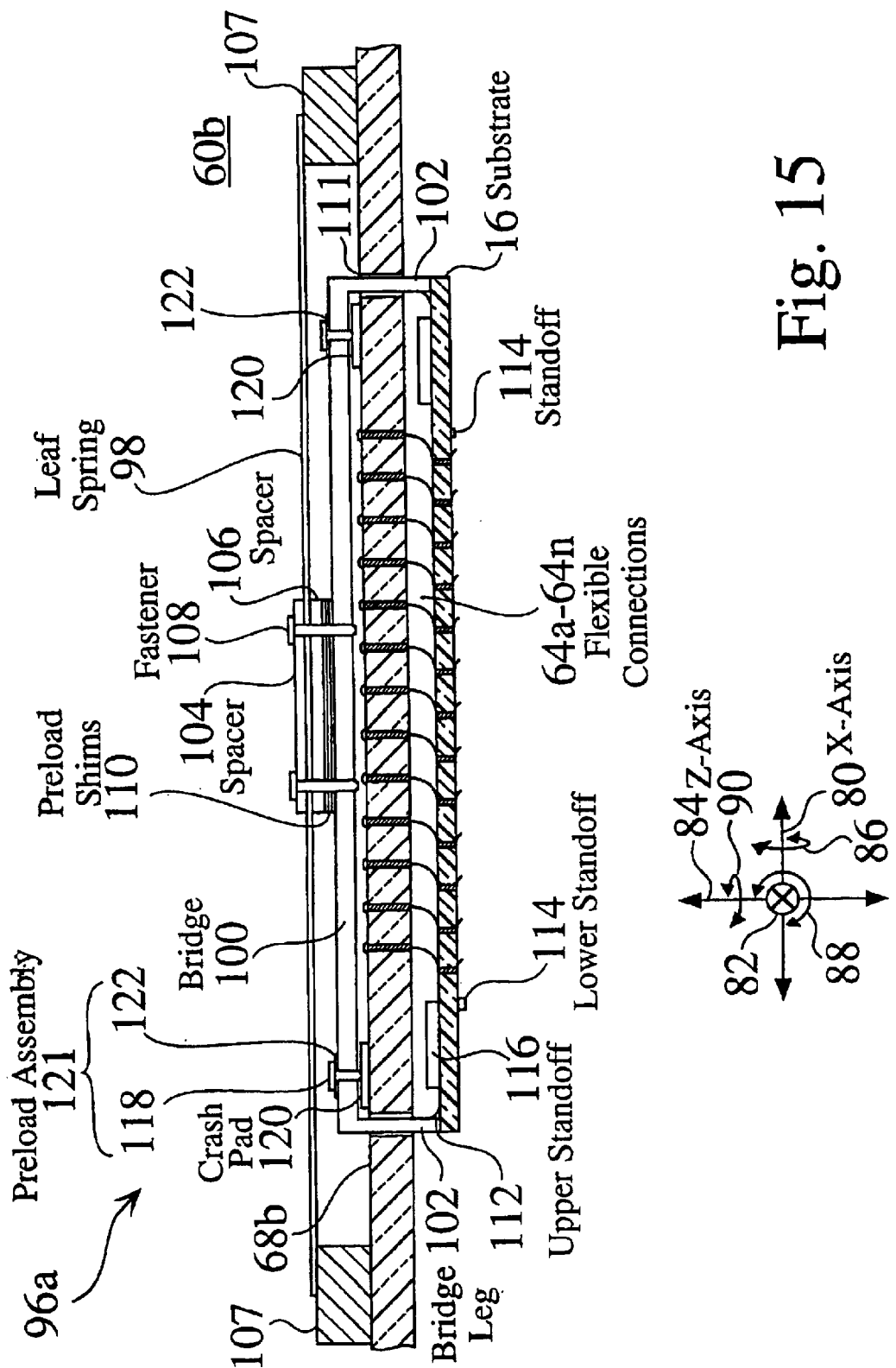
FIG. 15 is a first partial cross-sectional view of a bridge and leaf spring suspended probe card assembly.
Figure 17:
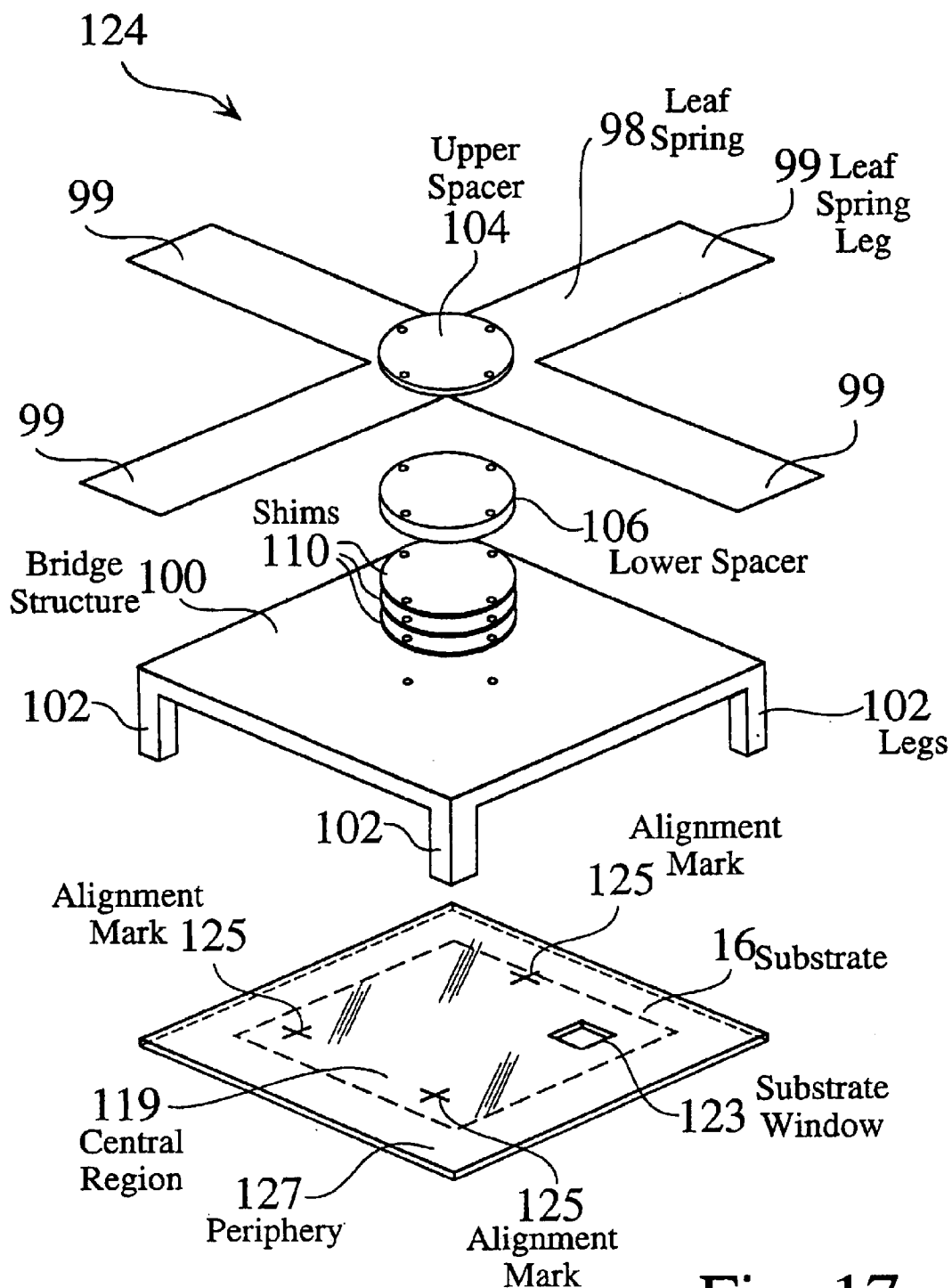
FIG. 17 is a partially expanded assembly view of a bridge and leaf spring suspended probe card assembly.

FIG. 15 is a first partial cross-sectional view 96a of a bridge and leaf spring suspended probe card assembly 60b. FIG. 16 is a second partial cross-sectional view 96b of the bridge and leaf spring suspended probe card assembly 60b shown in FIG. 15, which provides planarity compliance with one or more integrated circuit devices 44 on a semiconductor wafer 92, which may be non-coplanar with the probe card assembly 60b. FIG. 17 is a partial expanded assembly view 124 of major components for a bridge and spring probe card suspension assembly 60b.

A leaf spring 98 connects to the substrate 16 through a bridge structure 100. The leaf spring 98 and bridge structure 100 provide pivoting freedom for the substrate 16 (i.e. slight X-axis rotation 86 and Y-axis rotation), with controlled movement in the Z direction 84, X direction 80, Y direction 82 and Z-Axis rotation (theta) 90 directions. In preferred embodiments, a preload assembly 121 (FIG. 15) is used as a means for accurately setting the initial plane and Z position of the substrate 16 in relation to the printed wiring board probe card 68b, and to set the pre-load force of the leaf spring 98. For example, in the embodiment shown in FIG. 15 and FIG. 16, the preload assembly 121 comprises fasteners 118, which are used in conjunction with bridge shims 122. In alternate embodiments, the preload assembly 121 may comprise calibration screw assemblies or other standoffs 118.

As shown in FIG. 15 and FIG. 16, the outer edges of a leaf spring 99 are fixed to the printed wiring board probe card 68 along its outside edges by attachment frame 107. The center of the leaf spring 98 is connected to the bridge 100, by one or more fasteners 108, an upper bridge spacer 104, and a lower bridge spacer 106. Bridge preload shims 110 are preferably added, such as to vary the Z-distance between the leaf spring 98 and the bridge 100, which varies the pre-load of the downward force exerted by the leaf spring 98 on the bridge 100. The bridge 100 translates the support from the center out to the corners, and connects to the substrate 16 by a plurality (typically three or more) bridge legs 102. The bridge legs 102 protrude through leg openings 111 defined in the printed wiring board probe card 68, and are fixedly attached to the substrate 16, such as by adhesive or mechanical connections 112.

The leaf spring 98 is typically fabricated from a sheet of stainless steel or spring steel, and is typically patterned using chemical etching methods. The downward force is a function of the stiffness of the spring, the diameter of the spring spacers 104 and 106, as well as the size of the leaf spring 98.

While the leaf spring 98 shown in FIG. 16 has the shape of a cross, other geometric shapes may be used to provide downward force, tilting freedom, and X, Y, and theta translation resistance. For example, a leaf spring 98 having a cross-shape may include any number of wings 99. As well, the wings 99 may have asymmetrical shapes, which vary in width as they go from the outside edge towards the center. Also, the outside edge of the leaf spring 98 may be connected into a ring, to provide further stability of the leaf spring 98.

The bridge 100 and the spacers 104 and 106 are preferably comprised of light and strong metals, such as aluminum or titanium, to minimize the mass of the moveable structure 60b.

Figure 18:
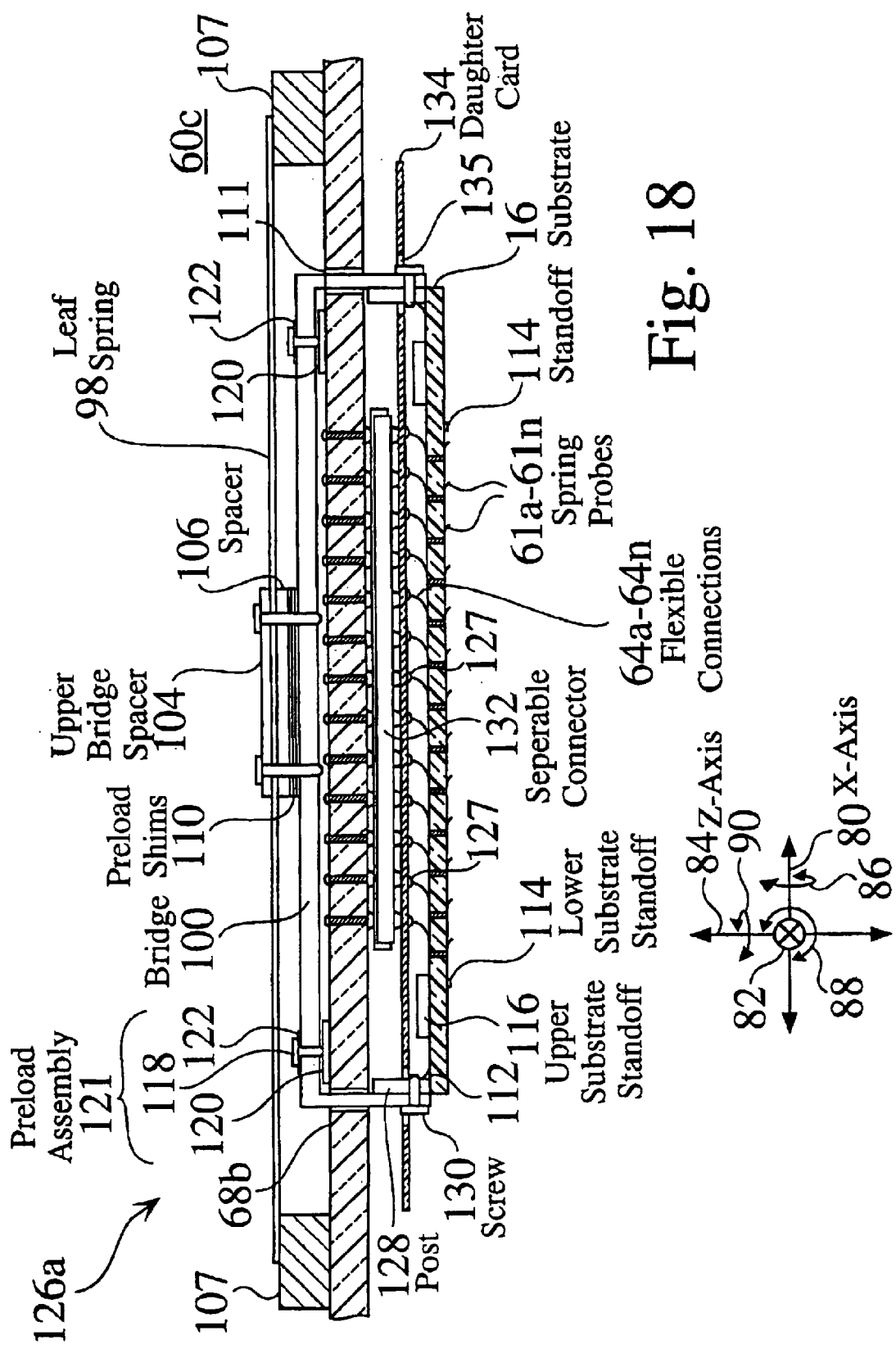
FIG. 18 is a first partial cross-sectional view of a bridge and leaf spring suspended probe card assembly, having an intermediate daughter card detachably connected to the probe card substrate, and wherein the probe spring substrate is detachably connected to the bridge structure.

The substrate 16 is typically attached to the legs 102 of the bridge 100, using an adhesive 112, such as an epoxy, or solder. Where substrate replaceability is needed, detachable connections 130 such as shown in FIG. 18 can be used.

On the bottom side 62a of the substrate 16, lower standoffs 114 are preferably used, which prevent the substrate 16 from touching a wafer under test 92. The lower standoffs 114 are preferably made of a relatively soft material, such as polyimide, to avoid damage to the semiconductor wafer under test 92. In addition, to further avoid damage to active circuits 44 in the semiconductor wafer 92, the standoffs 114 are preferably placed, such that when the probe card assembly 60 is aligned with a device 44 on a semiconductor wafer 92, the standoffs are aligned with the saw streets 94 (FIG. 13) on the semiconductor wafer 92, where there are no active devices 44 or test structures. Furthermore, the height of the lower standoffs 114 are preferably chosen to limit the maximum compression of the spring probes 61a–61n, thus preventing damage to the spring probes 61a–61n.

On the upper surface 62b of the substrate 16, upper standoffs 116 are also preferably used, to prevent damage to the topside flexible electrical connections 64a–64n. The upper standoffs 116 are preferably made of a moderately hard insulative material, such as LEXAN™, silicone, or plastic.

In the preferred embodiment shown in FIG. 15, FIG. 16 and FIG. 17, adjustable bridge screws 118 and bridge shims 122 are used to set the initial plane of the substrate 16, as well as to provide a downward stop to the substrate 16, so that the flexible connections 64a–64n are not damaged by over-extension.

Since printed wiring board probe cards 68b are typically made of relatively soft materials (e.g. such as glass epoxy), crash pads 120 are preferably placed on the probe card 68b, under the adjusting screws 118, to prevent the tip of the adjusting screws 118 from sinking into the printed wiring board probe card 68b over repeated contact cycles. Fastener shims 122 are also preferably used with the adjusting screws 118, such that the initial distance and planarity between the substrate 16 and the printed wiring board probe card 68b may be accurately set.

The preload shims 110 are preferably used to control the initial pre-load of the downward force exerted by the leaf spring 98 onto the bridge 100. The set preload prevents vibration of the substrate 16, and improves contact characteristics between the substrate 16 and the to the semiconductor water under test 92.

Figure 19:
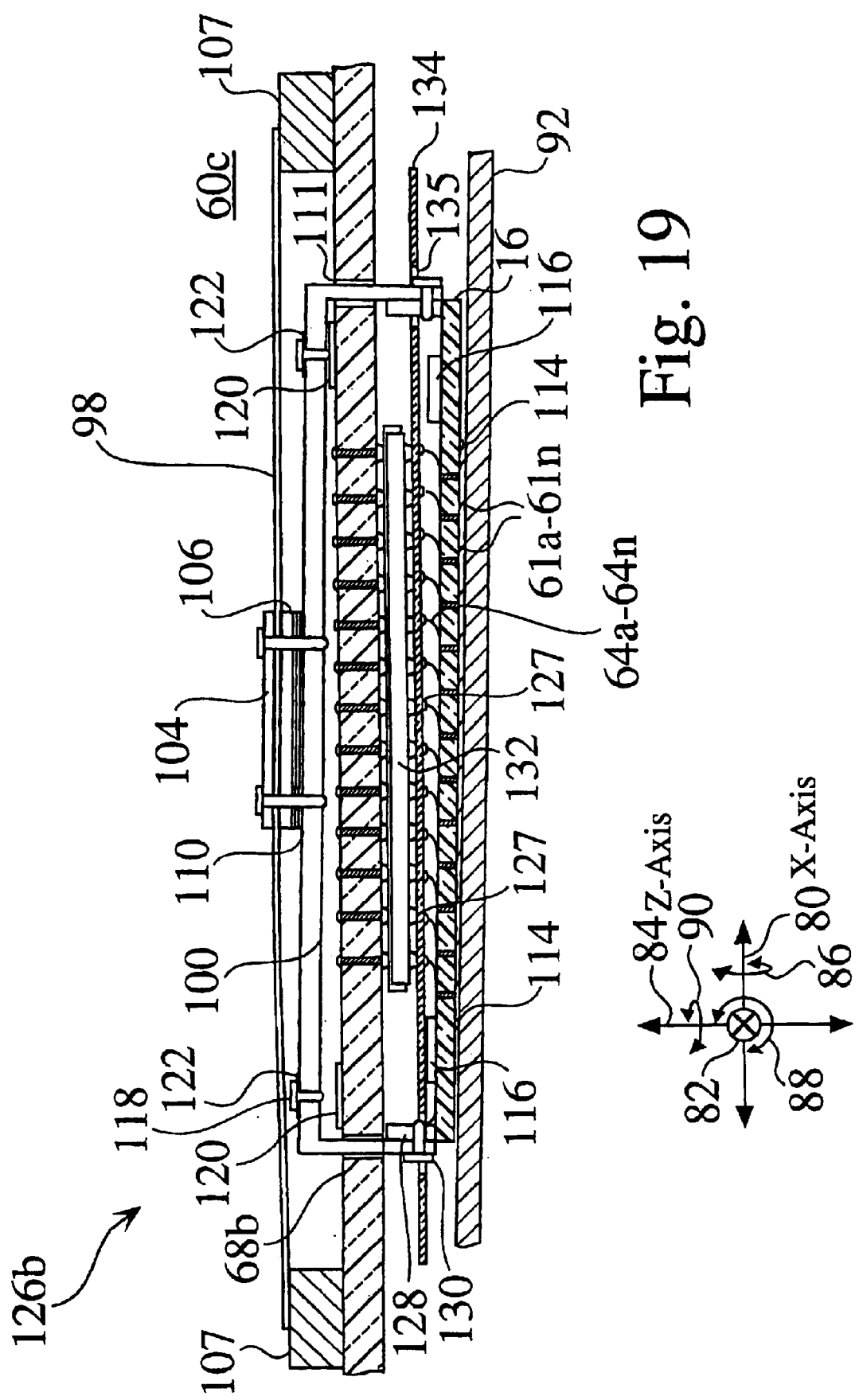
FIG. 19 is a second partial cross-sectional view of the bridge and leaf spring suspended probe card assembly shown in contact with a device under test (DUT)

FIG. 18 is a first partial cross-sectional view 126a of an alternate bridge and spring suspended probe card assembly 60c, having an intermediate daughter card 134 detachably connected to the printed wiring board probe card substrate 68*b*, and wherein the spring probe substrate 16 is detachably connected to the bridge structure 100. FIG. 19 is a second partial cross-sectional view 126*b* of the alternate bridge and spring suspended probe card assembly 60*c* shown in FIG. 18, which provides planarity compliance with one or more integrated circuit devices 44 on a semiconductor wafer 92, which is originally non-coplanar with the probe card assembly 60*c*.

A separable connector 132 is preferably used, which allows replacement of the substrate 16. Substrate attachment fasteners 130 (e.g. such as but not limited to screws) preferably extend through bridge legs 128, and allow the bridge 100 to be removeably connected to substrate posts 128, which are mounted on the upper surface 62*b* of the substrate 16.

In one embodiment of the probe card assembly 60, the preferred separable. connector 132 is a MEG-Array™ connector, manufactured by FCI Electronics, of Etters, Pa. One side of the separable connector 132 is typically soldered to the printed wiring board probe card 68, while the mating side is typically soldered to the daughter card 134, whereby the daughter card 134 may be removeably connected from the printed wiring board probe card 68*b*, while providing a large number of reliable electrical connections. The daughter card 134 preferably provides further fanout of the electrical connections, from a typical pitch of about 1 mm for the flexible connections 64*a*–64*n*, to a common pitch of about 1.27 mm for a separable connector 132.

Figure 20:
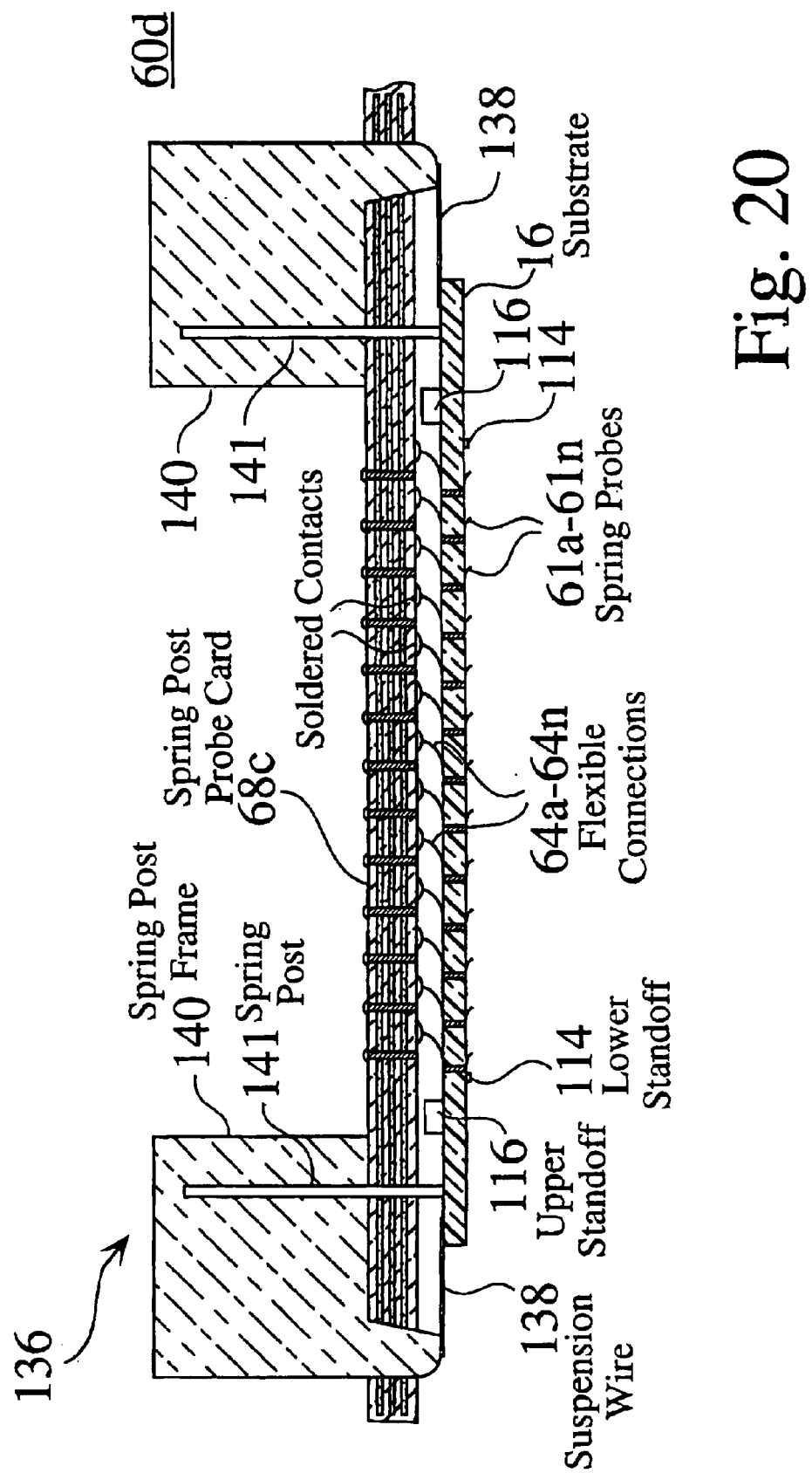
FIG. 20 is a cross-sectional view of a wire and spring post suspended probe card assembly.

FIG. 20 is a cross-sectional view 136 of a wire and spring post suspended probe card assembly 60*d*. A plurality of steel wires 138 (e.g. typically three or more) allow Z movement 84 of the substrate 16. The spring post frame 140, which is typically soldered or epoxied to the printed wiring board probe card 68*c*, typically includes one or more spring posts 141, which are preferably used to provide downward Z force, as well as to limit travel.

Figure 21:
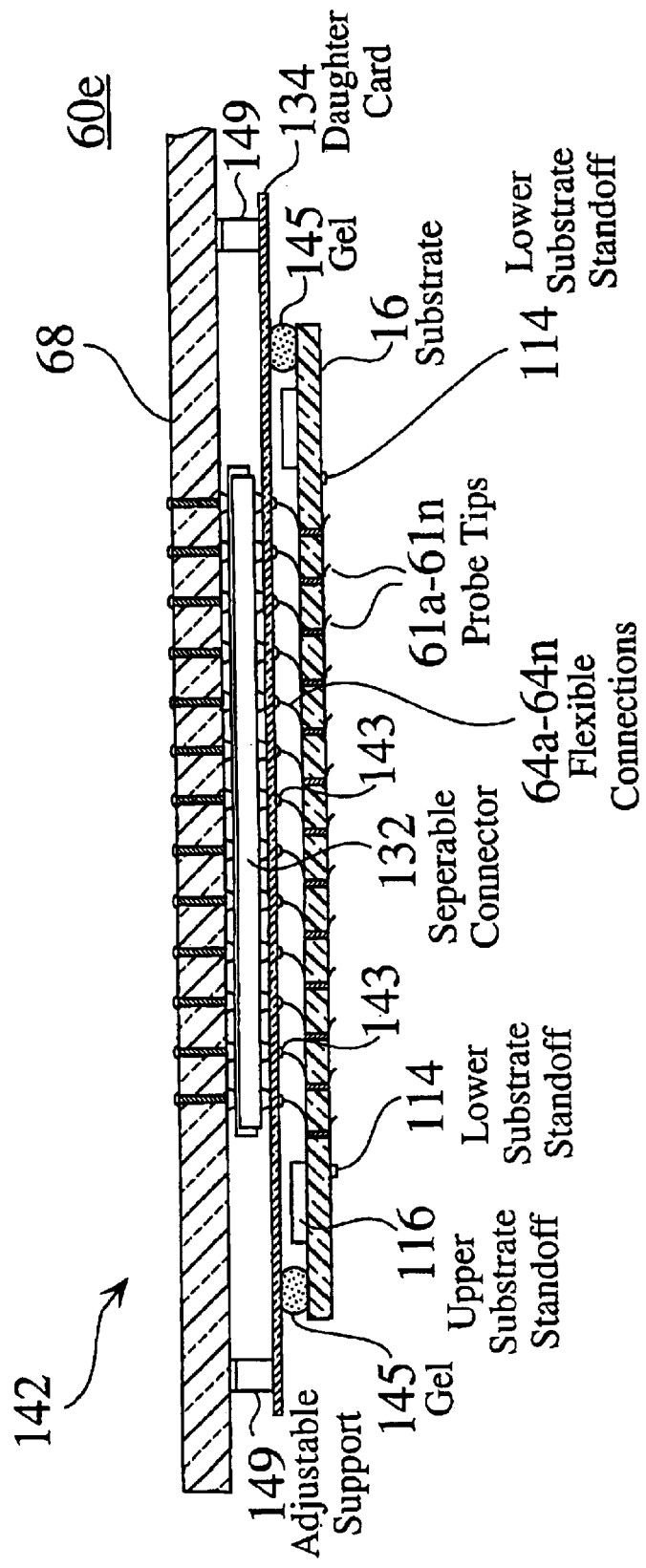
FIG. 21 is a cross-sectional view of a suspended probe card assembly having an intermediate daughter card detachably connected to the probe card substrate, and wherein the probe spring substrate is mechanically and electrically connected to the bridge structure by flexible interconnections.

FIG. 21 is a cross-sectional view 142 of a suspended probe card assembly 60*e* having an intermediate daughter card 134 detachably connected to the printed wiring board probe card 68 by a separable connector 132. The flexible connections 64*a*–64*n* are preferably made with springs 14, 34, 50, and provide both electrical connections to the printed wiring board probe card 68, as well as a mechanical connection between the printed wiring board probe card 68 and the daughter card 134. In the probe card assembly 60*e*, the flexible connections 64*a*–64*n* are permanently connected to conductive pads 143*a*–143*n* on the daughter card 134, using either solder or conductive epoxy. The flexible connections 64*a*–64*n* are preferably designed to provide a total force larger than that required to compress all the bottom side probe springs 61*a*–61*n* fully, when compressed in the range of 2–10 mils. As well, the flexible connections 64*a*–64*n* are preferably arranged, such that the substrate 16 does not translate in the X, Y, or Theta directions as the flexible connections 64*a*–64*n* are compressed.

Upper substrate standoffs 116 are preferably used, to limit the maximum Z travel of the substrate 16, relative to the daughter card 134, thereby providing protection for the flexible connections 64*a*–64*n*. The upper standoffs 116 are also preferably adjustable, such that there is a slight pre-load on the flexible connections 64*a*–64*n*, forcing the substrate 16 away from the daughter card 134, thereby reducing vibrations and chatter of the substrate 16 during operation. A damping material 145 (e.g. such as a gel) may also preferably be placed at one or more locations between the substrate 16 and the daughter card 14, to prevent vibration, oscillation or chatter of the substrate 16.

The separable connector 132 (e.g. such as an FCI connector 132) preferably has forgiving mating coplanarity requirements, thereby providing fine planarity compliance between the daughter card 134 and the printed wiring board probe card 68. A mechanical adjustment mechanism 149 (e.g. such as but not limited to fasteners 166, spacers 164, nuts 168, and shims 170 (FIG. 24)) may also preferably be used between the daughter card 134 and the printed wiring board probe card 68.

Figure 22:
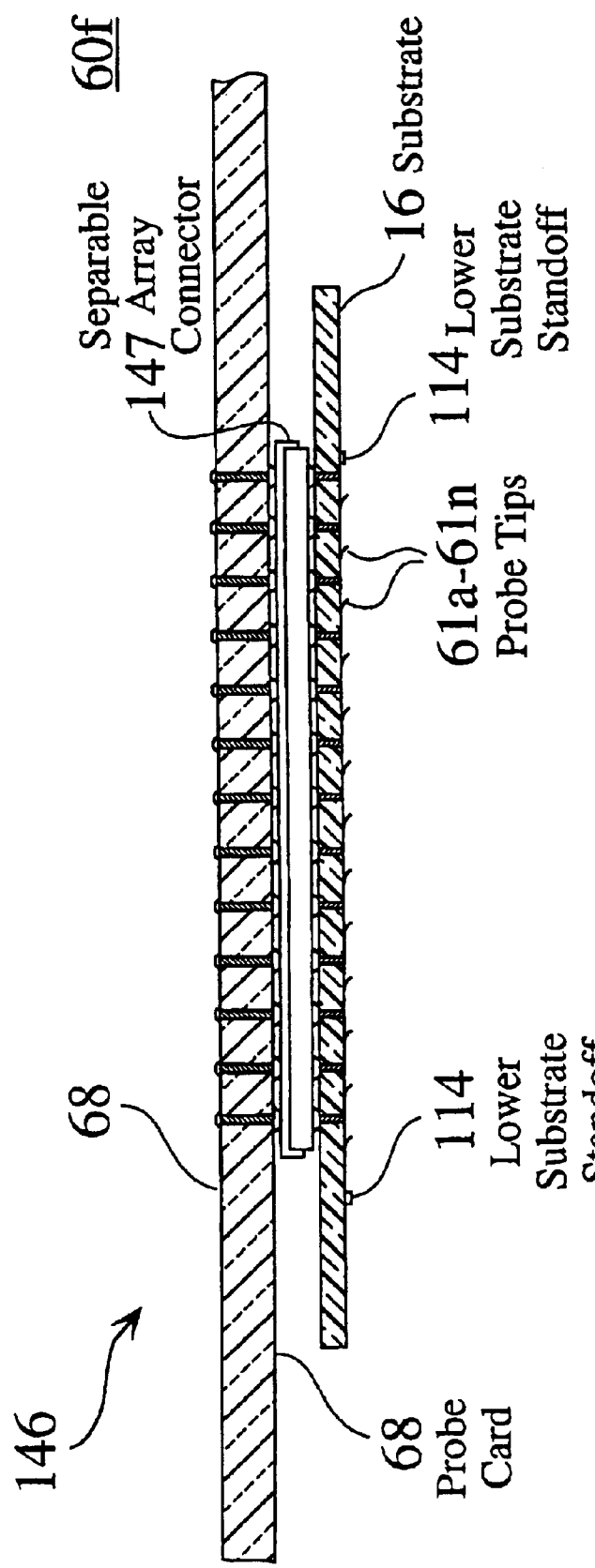
FIG. 22 is a cross-sectional view of a probe card assembly, wherein a nano-spring substrate is directly connected to a probe card substrate by an array connector.

FIG. 22 is a cross-sectional view 146 of a probe card assembly 60*f*, in which the probe spring substrate 16 is attached to a printed wiring board probe card 68 through a separable array connector 147. The probe card assembly 60*f* is suitable for small substrates 16, wherein a small non-planarity between the substrate 16 and a semiconductor wafer under test 92 can be absorbed by the spring probes 61*a*–61*n* alone.

Figure 23:
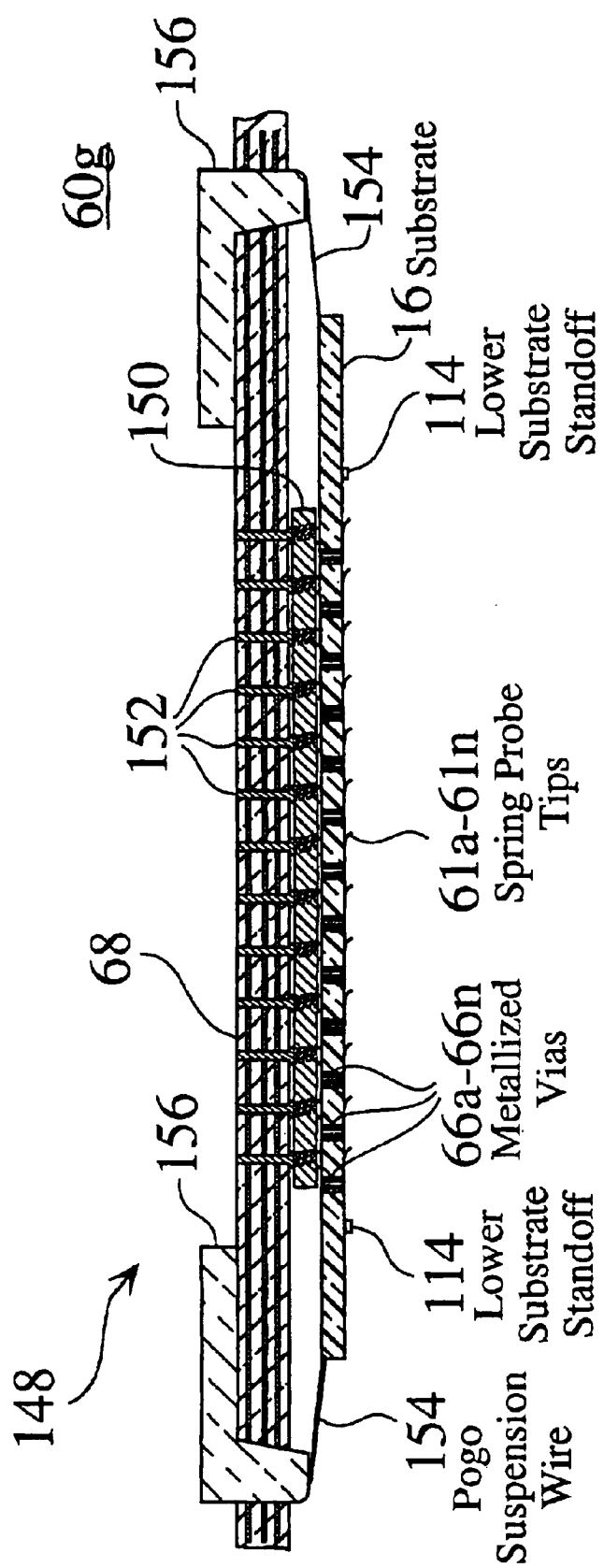
FIG. 23 is a cross-sectional view of a wire suspended probe card assembly, wherein a nano-spring substrate is connected to a probe card substrate by an LGA interposer connector.

FIG. 23 is a cross-sectional view 148 of a pogo wire suspended probe card assembly 60*g*, wherein a nano-spring substrate 16 is attached to a printed wiring board probe card substrate 68 by a large grid array (LGA) interposer connector 150. In one embodiment, the LGA interposer connector 150 is an AMPIFLEX™ connector, manufactured by AMP, Inc., of Harrisburg Pa. In another embodiment, the interposer connector 150 is a GOREMATE™ connector, manufactured by W. L. Gore and Associates, Inc., of Eau Clare, Wis. In another alternate embodiment, a pogo pin interposer 150 is used to connect opposing pogo pins 152 on the printed wiring board probe card 68 to electrical connections 66*a*–66*n* on the substrate 16. The substrate 16 is held by a plurality of steel pogo suspension wires 154, which are preferably biased to provide a slight upward force, thereby retaining the interposer connector 150, while preventing vibration and chatter of the assembly 60*g*.

Figure 24:
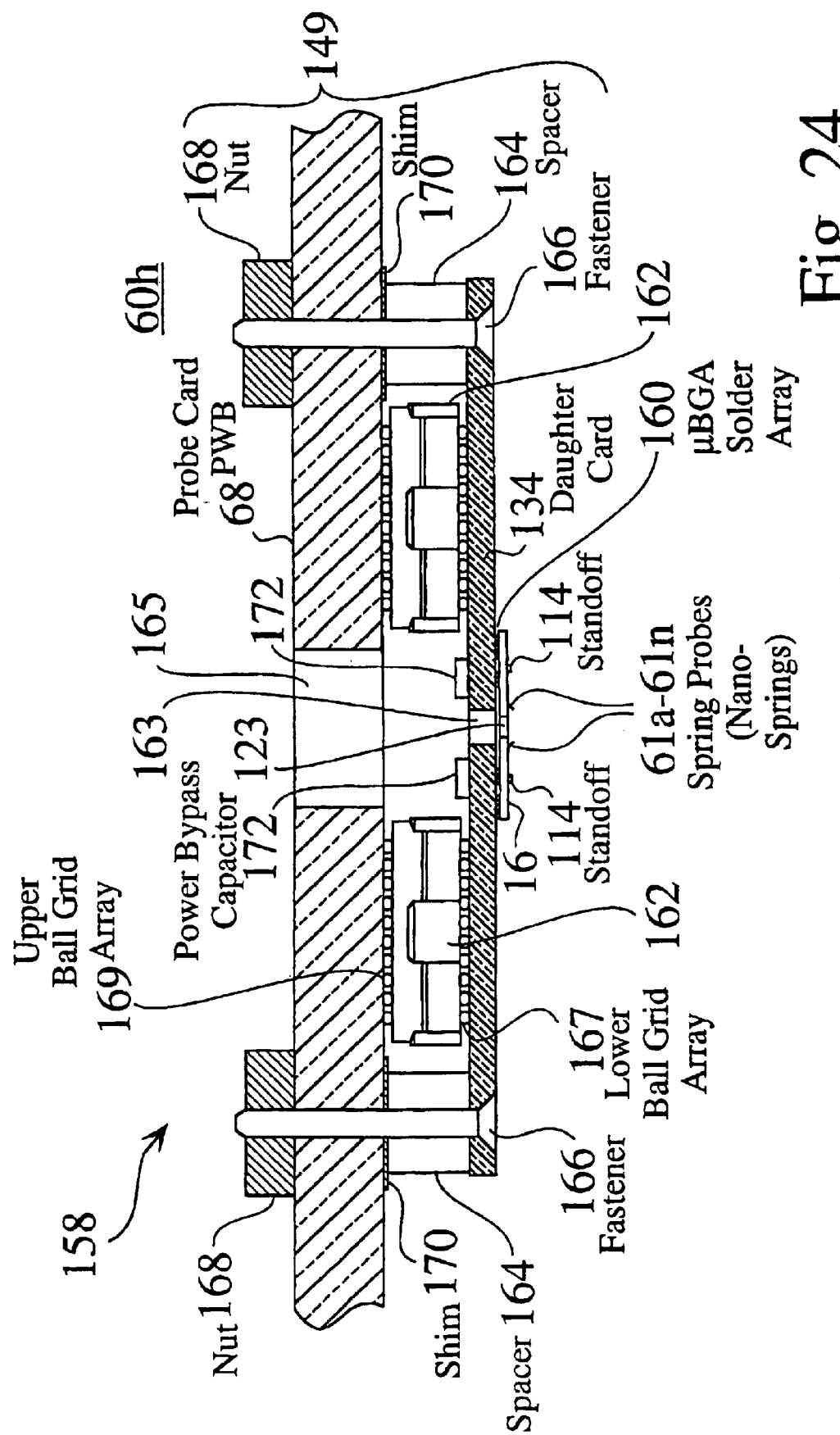
FIG. 24 is a cross-sectional view of a small test area probe card assembly, having one or more connectors between a probe card and a daughter card, in which the daughter card is attached to a small area probe spring substrate by a micro ball grid solder array.

Small Test Area Probe Assemblies. FIG. 24 is a cross-sectional view of a small test area probe card assembly 60*h*, having one or more area array connectors 162 located between the main printed wiring board probe card 68 and a daughter card 134, which is attached to a small area spring probe substrate 16.

While many of the probe card assemblies 60 described above provide large planarity compliance for a probe spring substrate 16, some probe card assemblies are used for applications in which the device under test comprises a relatively small surface area. For example, for applications in which a small number (e.g. one to four) of integrated circuits 44 are to be tested at a time, the size of a mating substrate 16 can also be relatively small (e.g. such as less than 2 cm square).

In such embodiments, therefore, the planarity of the substrate 16 to the wafer under test 92 may become less critical than for large surface areas, and the compliance provided by the probe springs 61*a*–61*n* alone is often sufficient to compensate for the testing environment. While the compliance provided by the probe springs 61*a*–61*n* may be relatively small, as compared to conventional needle springs, such applications are well suited for a probe card assembly 60 having photolithographically formed or MEMS formed spring probes 61*a*–61*n*.

The probe card assembly 60*h* is therefore inherently less complex, and typically more affordable, than multi-layer probe card assembly designs. The small size of the substrate 16 reduces the cost of the probe card assembly 60*h*, since the cost of a substrate 16 is strongly related to the surface area of the substrate 16.

The probe springs 61a–61n are fabricated on the lower surface 62a of a hard substrate 16, using either thin-film or MEMS processing methods, as described above. Signals from the probe springs 61a–61n are fanned out to an array of metal pads 182, 184, 186 (FIG. 26), located on the upper surface 62b of the substrate 16, using metal traces on one or both surfaces 62a,62b, and conductive vias 66a–66n through the substrate 16. The top side pads are connected to a daughter card 134, using common micro-ball grid solder array pads, typically at an array pitch such as 0.5 mm. The daughter card 134 further expands the pitch of the array, to pads having an approximate pitch of 0.050 inch on the opposing surface of the daughter card 134. An area array connector 162, such as a MEG-Array™ connector, from FCI Electronics Inc. of Etters Pa., is used to connect the 0.050 inch pitch pad array to the printed wiring board probe card 68. Power bypass capacitors 172, such as LICA™ capacitors from AVX Corporation of Myrtle Beach S.C., are preferably added to the daughter card 134, close to the substrate micro-BGA pads 182, 184, 186, to provide low impedance power filtering.

The small test area probe card assembly 60h preferably includes a means for providing a mechanical connection 149 between the printed wiring board probe card substrate 68 and the daughter card 134. In the probe card assembly 60h embodiment shown in FIG. 24, one or more spacers 164 and spacing shims 170 provide a controlled separation distance and planarity between the daughter card 134 and the printed wiring board probe card substrate 68, while one or more fasteners 166 and nuts provide a means for mechanical attachment 149. While a combination of spacers 164, shims 170, fasteners 166, and nuts 168 are shown in FIG. 24, alternate embodiments of the small test area probe card assembly 60h may use any combination of means for attachment 149 between the daughter card 134 and the printed wiring board probe card substrate 68, such as but not limited to spring loaded fasteners, adhesive standoffs, or other combinations of attachment hardware. In some preferred embodiments of the small test area probe card assembly 60h, the mechanical connection 149 between the printed wiring board probe card substrate 68 and the daughter card 134 is an adjustable mechanical connection 149, such as to provide for planarity adjustment between the printed wiring board probe card substrate 68 and the daughter card 134.

Lower substrate standoffs 114, which are typically taller than other features on the substrate 16 (except for the spring tips 61a–61n), are preferably placed on the lower surface 62a of the substrate 16, preferably to coincide with the saw streets 94 on a semiconductor wafer 92 under test, thereby preventing the wafer under test 92 from crashing into the substrate 16, and preventing damage to active regions on the semiconductor wafer 92.

As shown in FIG. 24, the substrate 16 preferably includes an access window 123 (FIG. 17), while the daughter card 134 also preferably includes a daughter card access hole 163, and the printed wiring board probe card 68 preferably includes and a probe card access hole 165, such that access to a semiconductor wafer 92 is provided while the probe card assembly 60h is positioned over the wafer 92 (e.g. such as for visual alignment or for electron beam probing). Access holes 123, 163, 165 may preferably be used in any of the probe card assemblies 60.

Figure 25:
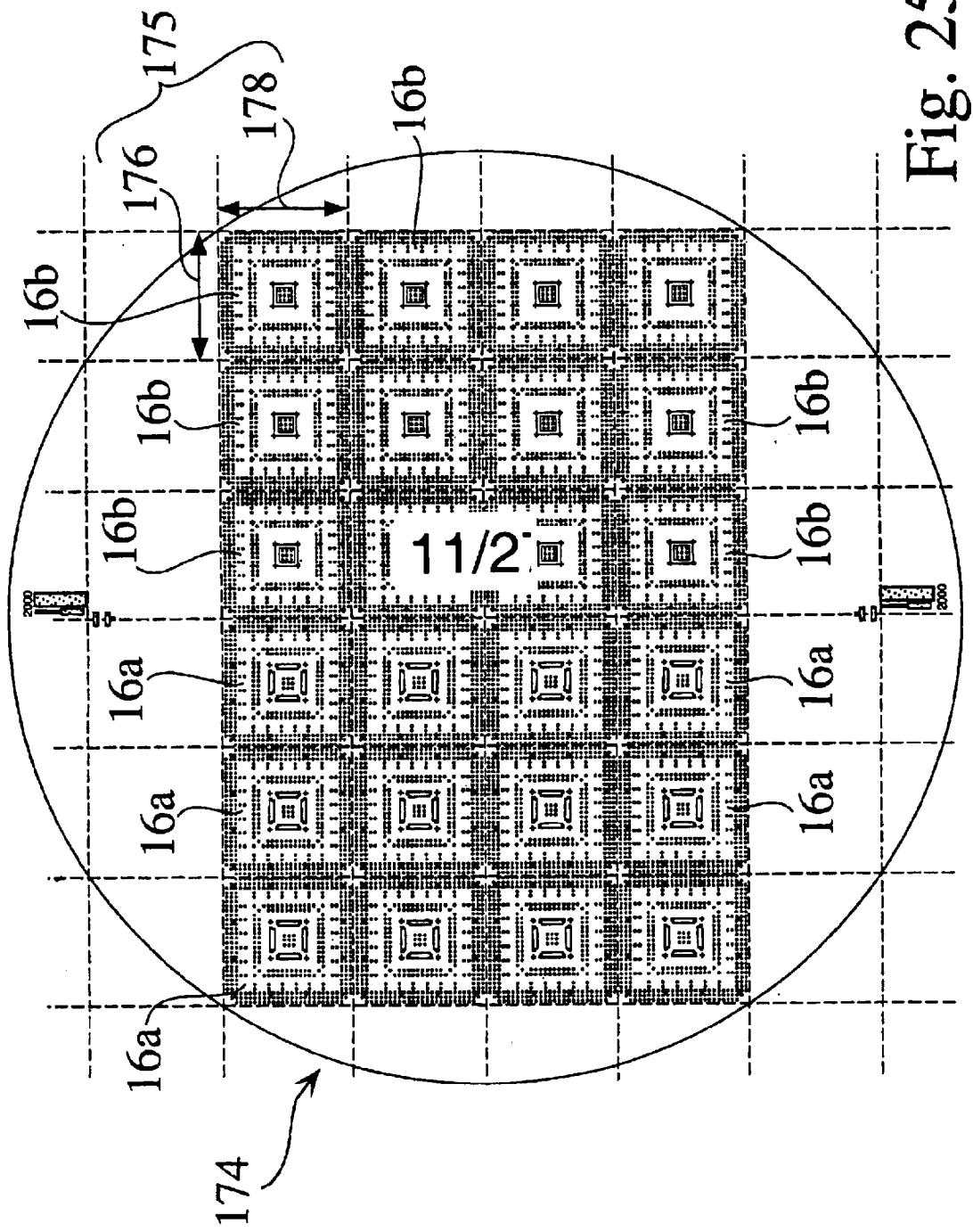
FIG. 25 is a top view of a substrate wafer, upon which a plurality of micro ball grid array probe spring contactor chip substrates are laid out.

FIG. 25 is a top view of a substrate wafer 174, upon which a plurality of micro ball grid array spring probe contactor chip substrates 16 are laid out. For spring probe substrates 16 having a small surface area 175, several spring probe contactor chip substrates 16 may typically be fabricated from a single wafer 174. For example, as shown in FIG. 25, as many as twenty four sites having a width 176 and a length 178 (e.g. 14 mm square), may be established on a standard four inch round starting wafer 174. As well, different substrates (e.g. 16a, 16b) may be fabricated across a starting wafer 174, whereby the cost of production (which may be significant) for different spring probe substrates 16 may be shared, such as for masking costs and processing costs. Therefore, the cost of development for different substrates 16a, 16b may be lowered significantly (e.g. such as by a factor of up to 10 or more).

Figure 26:
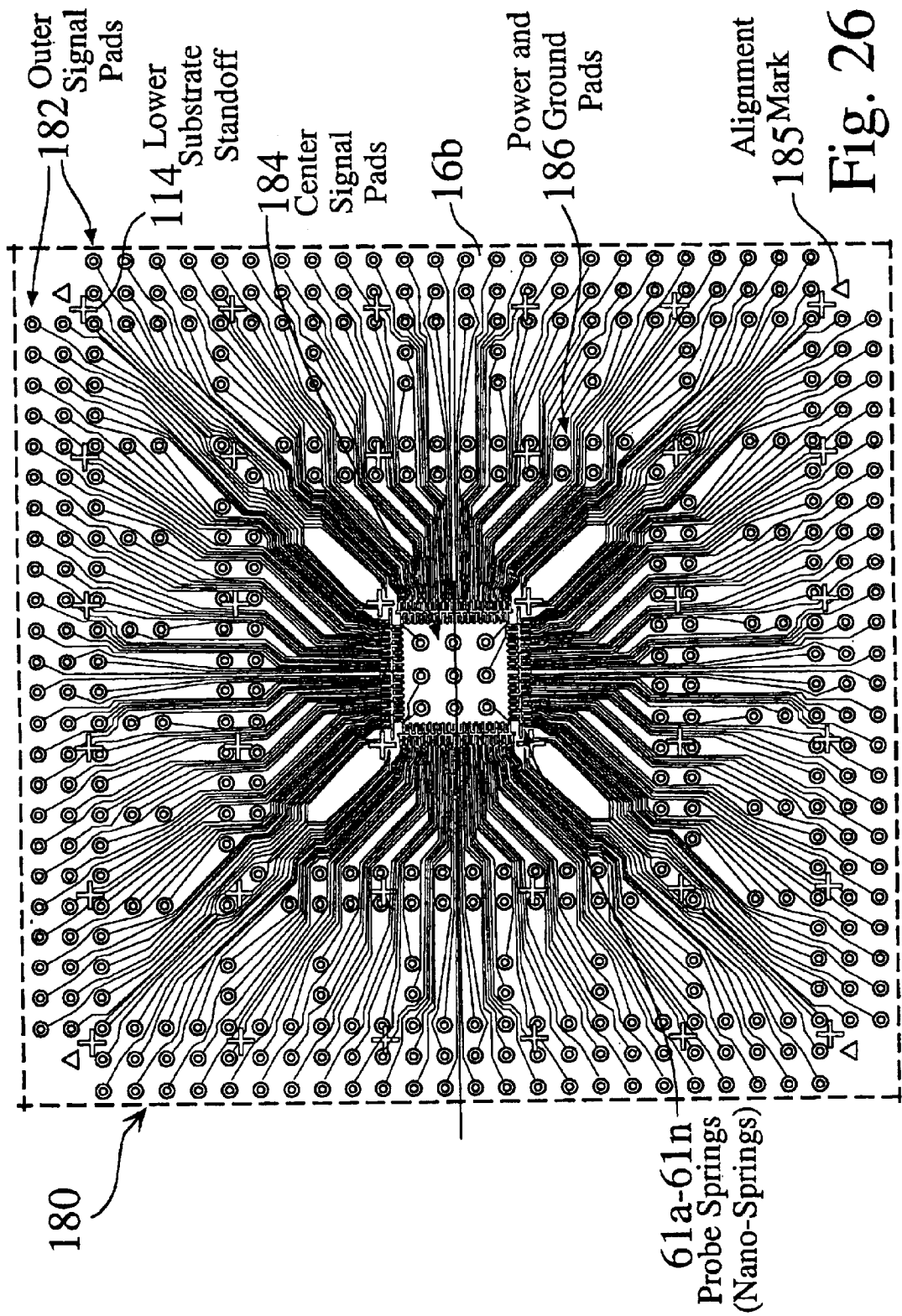
FIG. 26 is a top view of a single micro ball grid array nano-spring contactor chip.

FIG. 26 is a top view of a single 0.5 millimeter pitch micro ball grid array 180 for a 14 mm square spring probe contactor chip (NSCC) 16b. The micro BGA pads 182, 184, 186 are preferably on a standard pitch (e.g. 0.5 mm). The outer five rows of pads 182 and the center pads 184 provide 341 signal connections, and the inside two rows 186 provide ninety six dedicated power and ground connections. By customizing the routing traces to the spring probes 61a–61n, specific power/ground spring positions to match the integrated circuit 44 under test can be accommodated with a single layer of routing.

Standoffs 114 are preferably placed in locations matching inactive regions on the wafer 92, such as on the scribe lane 94, to prevent damage to active devices 44 on the device under test 44. One or more alignment marks 185 are also preferably located on the substrate wafer 174. The production cost and turnaround time for a probe card assembly 60 can be significantly improved, by standardizing the footprints of the micro BGA pad array 180, the daughter card 134, and the printed wiring board probe card 68. Standardization of the micro-BGA pad array 180, as well power/ground pad assignments for the pads located on the substrate 16b allows a standardized pattern of vias 66a–66n (as seen in FIG. 14) in the base substrate 174.

Standardization of other componentry for probe card assemblies 60 often allows printed wiring board probe cards 68 (and in some embodiments daughter cards 134), to be used for different substrates 16 and integrated circuit devices 44, wherein only the routing of the substrate 16 is customized.

The use of a starting substrate 174 (FIG. 25) having a standardized pattern of vias 66a–66n also allows starting substrates 174 to be ordered, stored and used in quantity, thus reducing the cost of starting substrates 174, and often reducing the lead time to obtain the starting substrates 174.

Alternate Applications for Probe Springs. Photolithographic or MEMS spring probes 61, 14, 34, 50 may alternately be used for bare die burn-in sockets, such as for DieMate™ burn-in sockets, manufactured by Texas Instruments Inc., of Mansfield Mass., or for Die™Pak burn-in sockets, available through Aehr Test, Inc. of Fremont Calif. For bare die burn-in. sockets which contact the substrate 16 around the edges, the probe springs 61 springs and fanout metalization are needed only on one surface (e.g. probe surface 62a) of the substrate 16. The required fanout is used to determine the size of the substrate 16, based on the number of the I/O signals needed to be routed to pads on the edge of the substrate 16. Alternately, vias 66 in the substrate 16, as described above, can be used to route the I/O signals to an array of pads on the opposite surface 62b of the substrate 16, allowing the substrate to be smaller, and thereby reducing the cost of fabrication.

Figure 27:
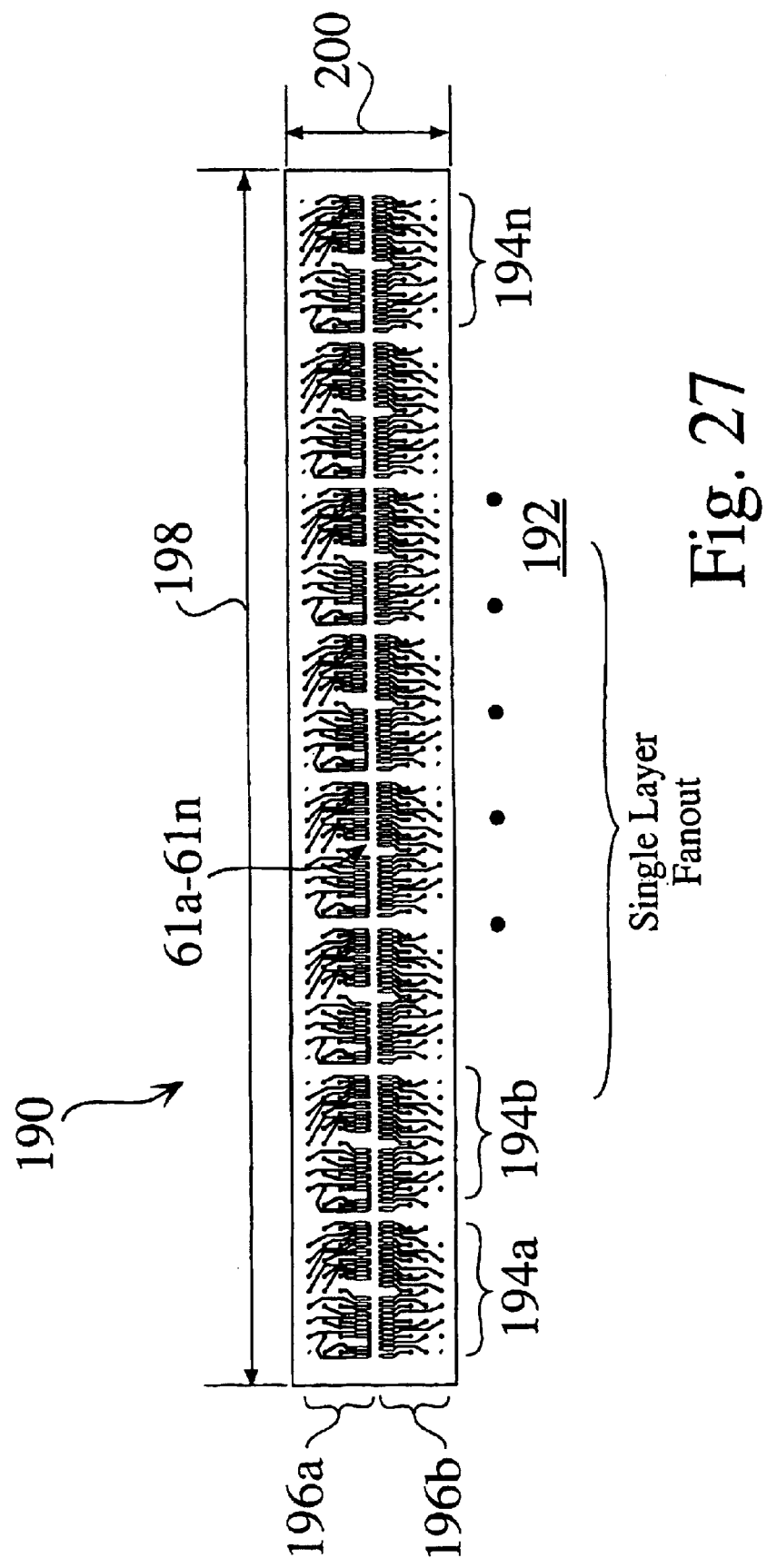
FIG. 27 is a plan view of a probe strip tile having a plurality of probe contact areas.

Tiled Probe Assemblies. FIG. 27 is a plan view 190 of a probe strip tile 192, having a probe strip length 198 and a probe strip width 200. The probe strip tile 192 has a plurality of probe contact areas 194a–194n, each having a plurality of spring probes 61a–61n. As well, in the embodiment shown, the spring probes 61a–61n are preferably laid out in aligned probe regions 196a, 196b (e.g. such as in longitudinally aligned regions 196a, 196b). Use of one or more probe strip tiles 192 in a probe card assembly allows simultaneous electrical contact with a plurality of integrated circuit devices 44 (e.g. thereby providing a "one to many" connection), such as for testing adjoining integrated circuit device sites 44 on a semiconductor wafer 92. The plurality of probe contact areas 194a–194n are preferably located symmetrically along the length and/or width of the probe strip tiles 192, such that they align with a symmetrical plurality of integrated circuit devices 44 on a wafer 92.

Probe strip tiles 192 may alternately be laid out and used for applications in which each single probe strip tile 192 provides contact with a single integrated circuit device site 44 (e.g. thereby providing one or more "one to one" connections), or for applications in which a plurality of probe strip tiles 192 provide contact for an integrated circuit device site 44 (e.g. thereby providing one or more "many to one" connections).

As well, the probe strip tiles 192, having spring probes 61a–61n, typically include electrical vias 66a–66n (e.g. such as metalized vias) and an array of electrical connections 64a–64n (FIGS. 1, 17, 21), such that while the spring probes 61a–61n may typically be laid out to match specific devices 44 under test, the probe strip tiles 192 may preferably include standard electrical vias 66a–66n and/or arrays of electrical connections 64a–64n. For example, in the probe card assembly 202 shown in FIG. 28 and FIG. 29, each of the probe strip tiles 192 includes a standard ball grid array 160 of solder connections. Therefore, while preferred embodiments of probe strip tiles 192 may include spring probes 61a–61n which are laid out to match specific devices 44 under test, the probe strip tiles 192 may be attached to standardized daughter cards 204 and/or to standardized intermediate connectors (e.g. such as to a separable connector 132), thus minimizing engineering development costs to produce a tiled probe assembly 202.

Figure 28:
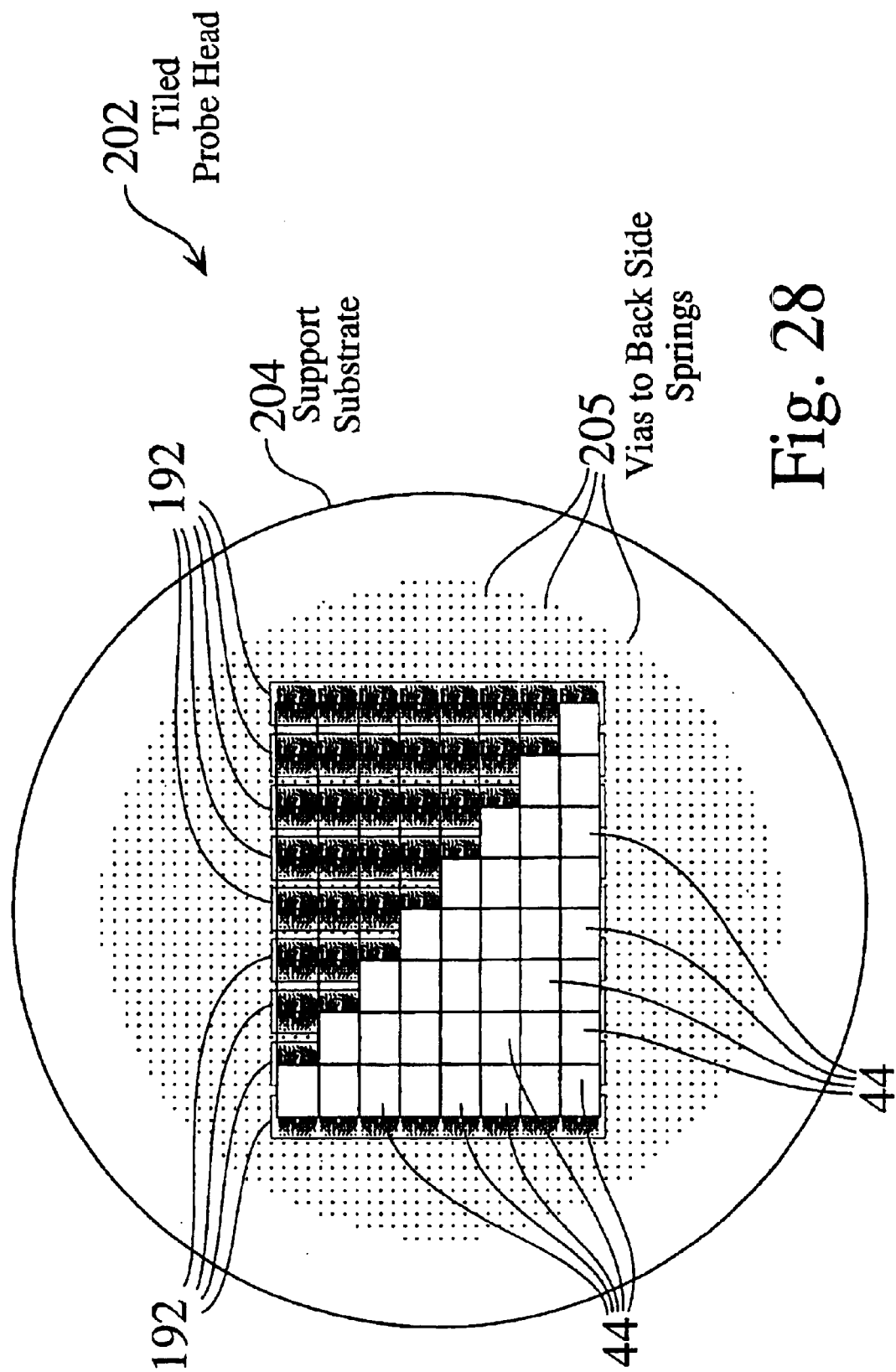
FIG. 28 is a bottom view of a plurality of probe strip tiles attached to a probe card support substrate.
Figure 29:
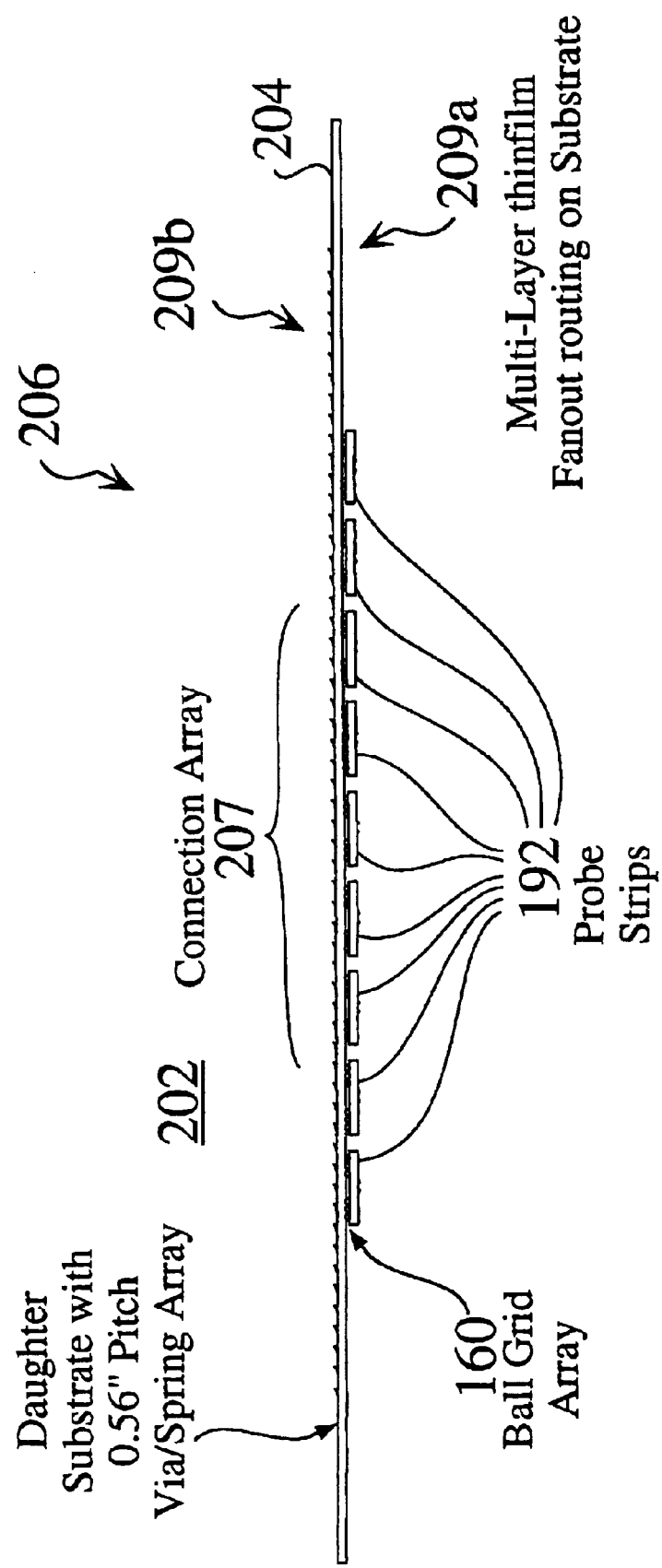
FIG. 29 is a side view of a plurality of probe strip tiles attached to a probe card support substrate.

FIG. 28 is a partial bottom view of tiled probe head 202 comprising a plurality of probe strip tiles 192 attached to a support substrate 204, which includes an array 207 (FIG. 29) of electrically conductive vias 205. FIG. 29 is a side view of a plurality of probe strip tiles 192 attached to a probe card, which are used to contact a plurality of integrated circuit devices 44 located on a semiconductor wafer 92. The tiled probe head 202 is typically used to contact a plurality of integrated circuit devices 44 located on a semiconductor wafer 92. The plurality of probe strip tiles 192 are preferably located symmetrically across the substrate 204, such that they align with a symmetrical plurality of integrated circuit devices 44 on a wafer 92.

The substrate 204 preferably has a low thermal coefficient of expansion (TCE), and is preferably matched to silicon. As well, the substrate 204 typically fans out a large number of signal traces 46, to connectors on the opposite surface 209b of the substrate 204. In one embodiment, the substrate 204 is a silicon wafer, which includes vias 205a–205n (e.g. such as arranged on a 0.056 inch pitch) and thin film routing 46 on one or both substrate surfaces 209a, 209b.

In the tiled probe head 202 shown in FIG. 28 and FIG. 29, the probe strip tiles 192 include groups of probe springs 61 which are used to contact rows of pads 47 (FIG. 7) on integrated circuit devices 44 having pads 47 located on opposing sides of a device under test 44 (e.g. such as on the right and left sides of an integrated circuit device site 44). In the tiled probe head 202 shown, the probe strip tiles 192 are arranged such that one of the probe strip tiles 192 typically contacts the right side of one circuit device site 44. (e.g. such as using probe contact region 196a in FIG. 27), in addition to contacting the left side of a neighboring circuit device site 44 (e.g. such as using probe contact region 196b in FIG. 27). The embodiment shown in FIG. 28 therefore provides simultaneous contact between the plurality of probe strip tiles 192 and a plurality of integrated circuit devices 44, while allowing adequate tolerances between adjoining probe strip tiles 192, wherein the side edges of the probe strip tiles 192 may preferably be placed over the saw streets of the integrated circuit device sites 44. For example, saw streets 94 between adjoining devices 44 on a wafer 92 may commonly be on the order of 4 to 8 mils wide, thereby providing a similar gap between probe strip tiles 192 in the tiled probe card assembly 202. While the illustrative embodiment shown portrays a linear arrangement of probe contact regions, the specific layout is not limited to the arrangement shown. For example, the tile layer may alternately be used to provide probe connections to any number of IC's, in any configuration.

In alternate embodiments of the tiled probe head assembly 202, all pads 47 for an integrated circuit device site 44 may be contacted by probes from a single probe strip tile 192.

Figure 30:
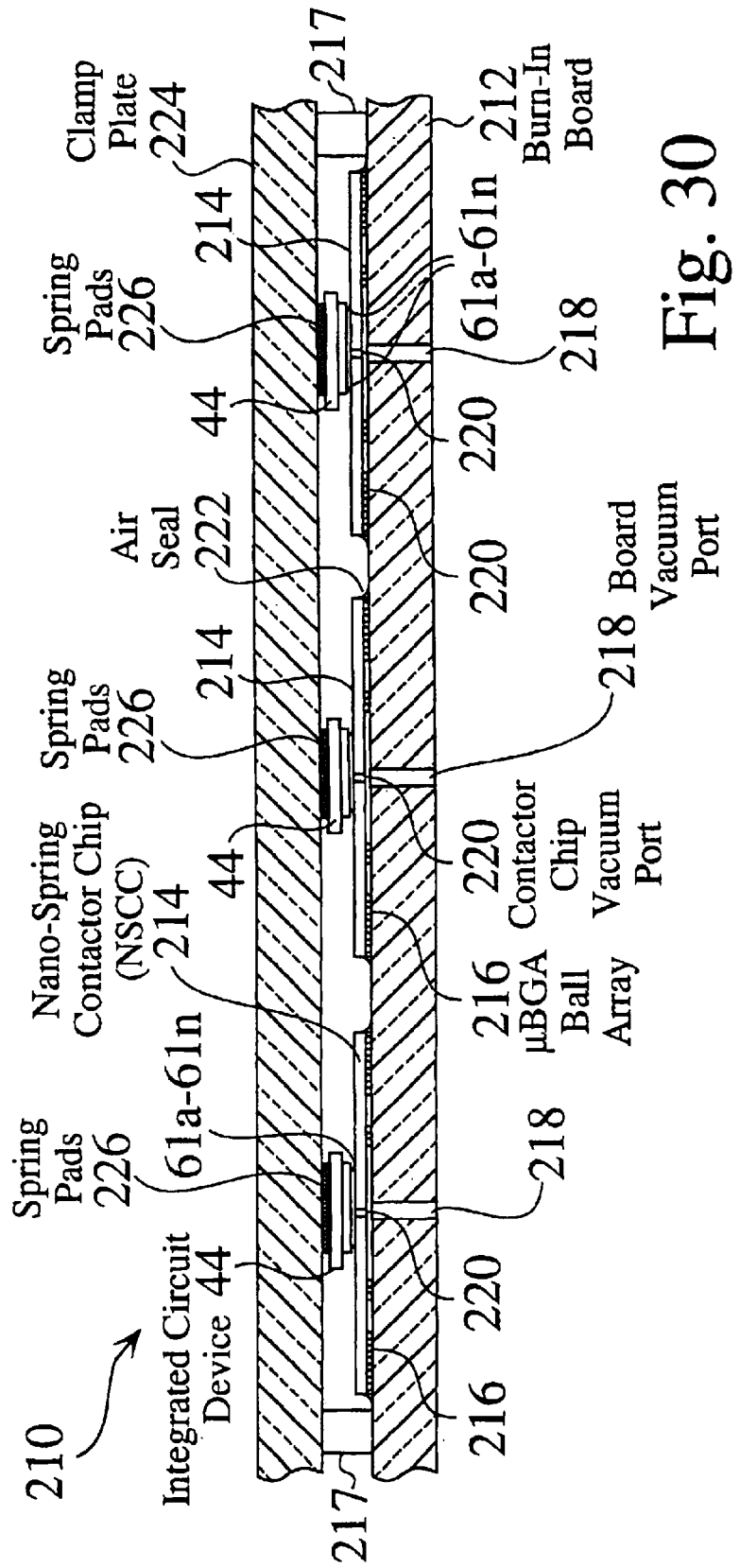
FIG. 30 is a cross-sectional view of a structure which allows a plurality of integrated circuits to be temporarily connected to a burn-in board, through a plurality of probe spring contacts.

Burn-In Structures. FIG. 30 is a partial cross-sectional view of a burn-in structure 210 which allows a plurality of integrated circuit devices 44 to be temporarily connected to a burn-in board 212. The burn-in board typically includes a variety of circuitry, components, and interconnections. An array of probe spring (i.e. nano-spring) contactor chips (NSCC) 214 are mounted onto a burn-in board 212, such as by micro ball grid arrays 216, which provide spring probe electrical connections 61a–61n between the plurality of integrated circuit devices 44 and external burn-in circuitry (not shown). In similar manner to substrate 16, as seen in FIG. 14, each of the contactor chip substrates 214 have a connection surface 62b, a probe contact surface 62a, a plurality of flexible electrically conductive probe spring tips 61a–61n extending from the probe contact surface 62a, and a plurality of electrical connections 66a–66n extending through each of the contactor chip substrates 214 between each of the flexible electrically conductive probe spring tips 61a–61n and the connector surface 62b.

Board vacuum ports 218 are preferably defined in the burn-in board 212, while contactor chip vacuum ports 220 are preferably defined in the NSCC substrate 214, wherein the board vacuum ports 218 are generally aligned to the contactor chip vacuum ports 220 (e.g. such that an applied vacuum through the board vacuum ports 218 is also applied to the generally aligned contactor chip vacuum ports 220). An air seal 222 (e.g. such as an epoxy), is preferably dispensed around the periphery of each nano-spring contactor chip 214, to prevent the loss of applied vacuum through the micro BGA ball array 216.

As integrated circuit devices 44 are initially placed on nano-spring contactor chips 214 (e.g. such as by a "pick and place" machine), an applied vacuum to the board vacuum ports 218 on the burn-in board 212 and generally aligned contactor chip vacuum ports 220 on the nano-spring contactor chips 214 prevents the placed integrated circuit devices 44 from shifting from their placed positions.

When all of the integrated circuit devices 44 are placed onto the corresponding contactor chips 214, a clamp plate 224 is preferably placed in contact with the integrated circuit devices 44, to retain the integrated circuit devices 44 in place during burn-in operation. Individual spring pads 226 may also be used, to push on-the integrated circuit devices 44 under test, to allow for planarity tolerances of the clamp plate 224 and the burn-in board 212. The burn-in structure 210 preferably includes means 217 for retaining the clamp plate 224, such that once the clamp plate 224 is placed in contact with the integrated circuit devices 44, the clamp plate 224 is attached to the burn-in board 212, and the applied vacuum may be switched off.

Protective Coating Processes for Improved Spring Probes. As described above, since spring probes 61 provide advantages of high pitch, high pin count, and flexibility, they may be used for a wide variety of applications. However, when these typically small spring probes 61 are used to contact pads 47 on integrated circuit devices 44, such as on semiconductive wafers 92, wherein the pads 47 often contain an oxide layer, the spring probes 61 are often required to break through oxide layers and establish adequate electrical contact with metal traces or conductive pads. As the spring probes 61 are often used many times, the small, unprotected spring probe tips 24 may become worn. Therefore, it would be advantageous to provide an electrically conductive wear coating on the contact tips 24 of the probe springs 61. However, such a protective coating is required to cover both the top surface and the side wall surfaces of the spring tip 24.

As described above, the probe springs 61 may be formed by a sputter deposition and photolithographic process, such as disclosed in U.S. Pat. No. 5,848,685 and U.S. Pat. No. 5,613,861, wherein successive layers of conductive material are applied to a substrate, and wherein non-planar springs are subsequently formed. In such processes, however, a protective coating applied during the deposition process would not inherently provide a continuous coating on all surfaces of the formed non-planar probe springs.

Figure 31:
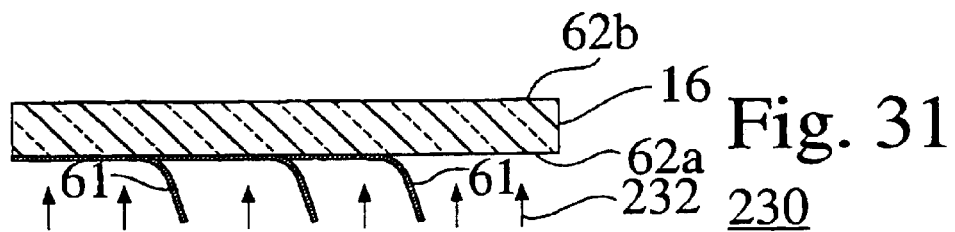
FIG. 31 is a view of a first step of a spring probe assembly coating process, in which a protective coating is applied to a probe surface of a spring probe assembly.

The probe springs 61, after their release, are not planar to the substrate surface. Therefore, a protective coating may be applied after the springs 61 have been released from the release layer 18. FIG. 31 is a view of a first step 230 of a spring probe assembly coating process, in which a protective coating 232 is applied to a probe surface of a spring probe assembly substrate 16, having one or more non-planar probe springs 61. The spring probe assembly coating process forms a protective layer on the non-planar probe springs 61. While the coating process may be used for a wide variety of non-planar structures, it is specifically useful for the processing of thin film and MEMS probe spring contacts 61. In FIG. 31, the applied electrically conductive protective coating is preferably a hard electrically conductive material, such as titanium nitride, palladium, rhodium, tungsten, nickel, or beryllium copper. The applied electrically conductive protective coating is also preferably relatively inert or noble material, thereby providing lubricative characteristics (i.e. a low coefficient of friction) for the probe tips 24 on the spring probes 61. Such materials minimize wear to both devices under test and to the spring probes 61, by minimizing galling and oxidation, while reducing the pickup of debris.

When the protective coating 233 is applied 232 to the substrate 16 and probes 61, the protective coating 233 covers both the planar and non-planar regions on the exposed surface 62 of the substrate 16. While the spring probes 16 are covered with the protective coating 233 during the coating step 230, all the traces on the substrate structure are electrically shorted together, from the applied conductive coating 233. The conductive coating 233 is therefore required to be patterned, or partially removed, to restore electrical isolation between different probe springs 61 and their respective traces. While conventional photo-masking processes are typically used in the majority of integrated circuit processing, to selectively etch away conductive coatings, such as titanium nitride coatings, such photo-masking processes are used for planar structures.

Figure 32:
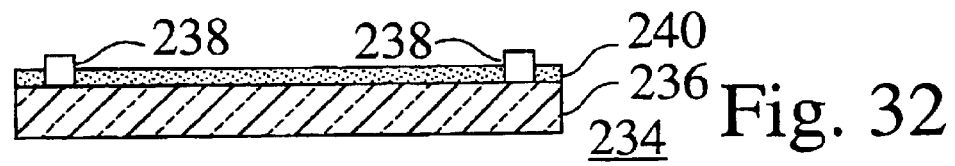
FIG. 32 is a view of a second step of a spring probe assembly coating process, in which a layer of photoresistive material is applied to a second substrate.

FIG. 32 is a view of a second step 234 of a spring probe assembly coating process, in which a layer of mask coating material 240 (e.g. approximately 10 microns deep) is applied to a second substrate 236, which preferably has dipping standoffs 238 (e.g. approximately 30 microns high). The mask coating material 240 preferably comprises a photoresistive material 240, or may alternately comprise another suitable coating materials 240 (e.g. such as silicone, wax, or epoxy) which are typically used within photolithographic processes. The coating material 240 is used to protect the applied protective layer 233 on non-planar portions of the probe springs 61.

Figure 33:
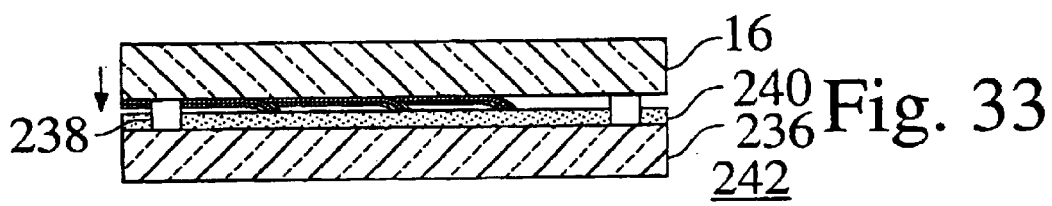
FIG. 33 is a view of a third step of a spring probe assembly coating process, in which a coated spring probe assembly is partially dipped into photoresistive material on a second substrate.

FIG. 33 is a view of a third step of a spring probe assembly coating process, in which a coated spring probe assembly is partially and controllably dipped 242 into the coating material 240 on the second substrate 236. The depth of applied coating material 240 eventually controls the remaining protective coating 233. The substrate 16 is lowered to a desired depth in the coating material 240, which is typically controlled by the applied depth of the coating material 240 on the second substrate 236, and the height of the dipping standoffs 20. The applied depth may alternately controlled by an operator, such as by controlled axial movement of a processing apparatus, to control the movement of the substrate 16 into the photoresistive material 240. The coating material may alternately be applied by a variety of techniques, such as the alternate coating process seen in FIG. 37, FIG. 38, and FIG. 39.

Figure 34:
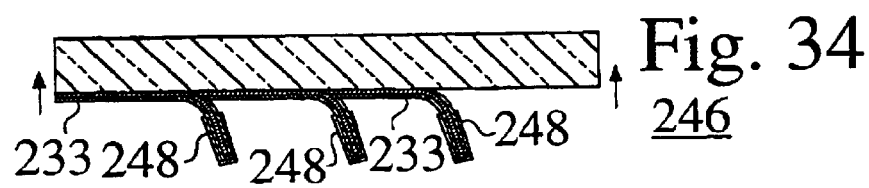
FIG. 34 is a view of a fourth step of a spring probe assembly coating process, in which a coated and partially dipped spring probe assembly is removed from the second substrate.
Figure 35:
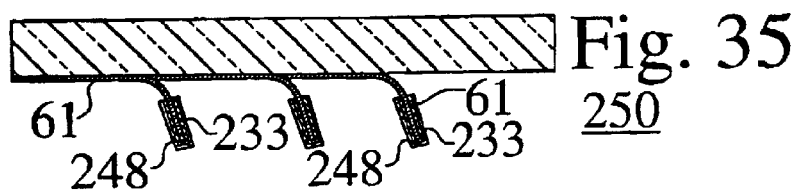
FIG. 35 is a view of a fifth step of a spring probe assembly coating process, in which the coated and dipped spring probe assembly is etched, thereby removing the protective coating from portions of the substrate not dipped in the photo-resist.
Figure 36:
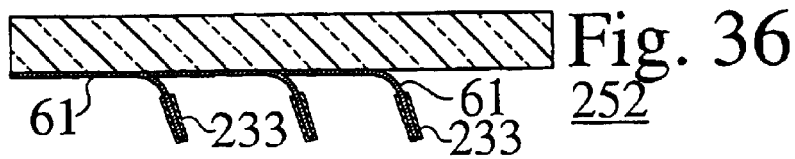
FIG. 36 is a view of a sixth step of a spring probe assembly coating process, in which photo-resist is stripped from the spring tips on the spring probe assembly, exposing the protective coating.

FIG. 34 is a view of a fourth step of a spring probe assembly coating process, in which a coated and partially dipped spring probe assembly is removed 246 from the photoresistive material 240 on second substrate 16 and cured (e.g. such as by soft baking), leaving a portion of the protectively 233 coated probe springs 61 covered in a cured coating layer 248. FIG. 35 is a view of a fifth step of a spring probe assembly coating process, in which the coated and dipped spring probe assembly 16,61 is etched 250, thereby removing the protective coating 233 from portions of the substrate 16 (i.e. the field area of the substrate 16) and probe springs 61 not dipped covered in a cured coating layer 248. FIG. 36 is a view of a sixth step of a spring probe assembly coating process, in which cured coating layers 248 are stripped from the portions of the probe springs 61 which were covered in a coating layer 248, thereby exposing the protective coating 233.

The non-planar probe spring coating process therefore provides a protective coating 233 to the tips 24 of the probe springs 61, while etching the unwanted protective coating in the substrate surface 16 and portions of the spring probes 61 which are not coated with coating layers 248.

Alternate Coating Techniques. FIG. 37 is a first perspective view 260 of an alternate probe spring tip coating process. As described above, a substrate 16 is provided, having one or more spring probes 61 located within a region 262 on a surface (e.g. such as probe surface 62a) of the substrate 16, such that spring probes 61 extend from the surface 62. As shown in FIG. 37, wire rods 264, having a rod diameter 267 (FIG. 39), is controllably located on the surface 62 of the substrate 16.

Figure 39:
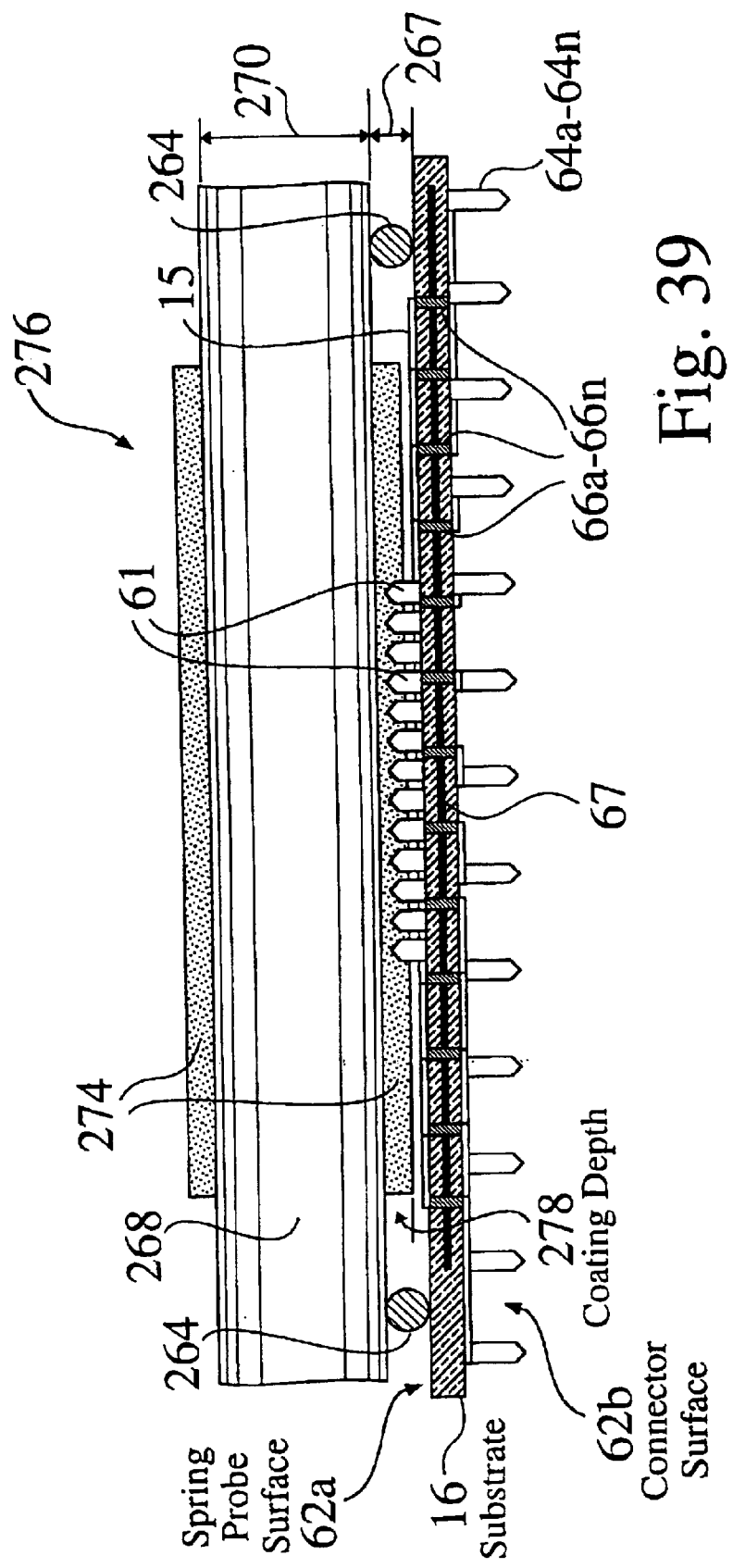
FIG. 39 is a partial cutaway view of an alternate probe spring tip coating process.

FIG. 38 is a second perspective view 266 of an alternate probe spring tip coating process, in which a central region 272 of a cylindrical roller 268, preferably having a uniformly precise roller diameter 270, is applied with a coating 274. The roller diameter 266 is preferably chosen such that the circumference of the cylindrical roller 268 is larger than the length of the substrate 16. FIG. 39 is a partial cutaway view 276 of the alternate probe spring tip coating process shown in FIG. 38. The applied coating 274 preferably has a controlled thickness 278 on the cylindrical roller 268. In some preferred embodiments of the alternate probe spring tip coating process, the cylindrical roller 268 is a precision centerless ground roller 268, preferably having a dimensional diameter tolerance of ±0.1 mil. While the coating 274 is typically photoresist material, it may alternately be any suitable material for controllably masking the probe tips 24, such as silicone or wax material.

As shown in FIG. 38 and FIG. 39, the coated roller 268 is controllably moved, such as by rolling, across the wire rods 264, whereby the probe tips 24, which extend from the surface 62 of the substrate are controllably coated with the coating 274. Since the circumference of the cylindrical roller 268 is preferably larger than the length of the substrate 16, the applied coating 274 is more uniformly applied across the substrate 16. The alternate coating process 260,266, 276 shown in FIG. 37, FIG. 38, and FIG. 39, respectively, may be used in any of the spring probe assembly coating processes. As well, the alternate coating process 260,266 may be advantageously applied to other coating applications.

Alternate Spring Probe Assembly Coating Processes. FIG. 40 is a view of a first step 280 of an alternate spring probe assembly coating process, in which a protective coating layer 233 (FIG. 41) is applied 232 to a probe surface 62a of a spring probe assembly 16, having one or more non-planar springs 14,61,64. While the alternate coating process may be used for a wide variety of non-planar structures, it is specifically useful for the processing of thin film and MEMS probe spring contacts 14,61,64.

The protective coating 233 is preferably a hard electrically conductive material 286, such as comprising titanium nitride, palladium, rhodium, tungsten, or nickel, and is typically applied 232 by sputter coating or other deposition methods. The applied electrically conductive protective coating 233 is also preferably an hard, non-oxidizing and non-galling material, thereby providing lubricative characteristics (i.e. a low coefficient of friction) for the probe tips 24 on the spring probes 61, thus minimizing wear to both devices under test and to the spring probes 61.

As described above, when the protective coating 233 is applied 232 to the substrate 16 and probes 61, the protective coating 233 covers both the planar and non-planar regions on the exposed surface 62 of the substrate 16. While the spring probes 16 are covered with the protective coating 233 during the coating step 280, all the traces on the substrate structure are electrically shorted together, from the applied conductive coating 233. The conductive coating 233 is therefore required to be patterned, or partially removed, to restore electrical isolation between different probe springs 61 and their respective traces. While conventional photo-masking processes are typically used in the majority of integrated circuit processing, to selectively etch away conductive coatings, such as titanium nitride coatings, such photo-masking processes are used for planar structures.

FIG. 41 is a view of a second optional step 282 of an alternate spring probe assembly coating process, in which a hard mask 286 (FIG. 42) is optionally applied 284 to a probe surface 62a of a coated spring probe assembly 16. The hard mask 286 is preferably a magnesium, aluminum, or magnesium oxide hard mask layer 286, and is typically applied 282 by sputter coating or electron beam (i.e. e-beam) evaporation. The optional hard mask layer 286 is preferably used for applications in which a coating layer 294 (FIG. 43) may not readily adhere to the first probe coat material 233.

FIG. 42 is a view of a third step 288 of an alternate spring probe assembly coating process, in which a portion of the non-planar probe springs 61 (e.g. such as the probe spring tips 24) of a coated spring probe assembly are controllably coated 290 with a coating layer 294 (FIG. 43). The coating layer 294 preferably comprises a photoresistive material 294 (e.g. approximately 10 microns deep), or may alternately comprise another suitable coating materials 294 (e.g. such as silicone, wax, or epoxy) which are typically used within photolithographic processes. The coating material 294 is used to protect the applied protective layer 233 (and is optionally also used to coat the hard mask layer 286) on non-planar portions of the probe springs 61. The depth of applied coating 294 eventually controls the remaining protective coating 233. The coating 294 may be controllably applied by a number of techniques, such as but not limited to dipping (e.g. as shown in FIG. 33), or by application of a roller 268 (e.g. such as shown in FIG. 38 and FIG. 39). The applied depth may alternately controlled by an operator, such as by controlled axial movement of a processing apparatus, to control the movement of the substrate 16 into the coating material 294. The coating layer 294 may also optionally require a secondary curing process, such as but not limited to soft baking, as shown in FIG. 34.

FIG. 43 is a view of an optional fourth step 292 of an alternate spring probe assembly coating process, in which the uncoated portion of the optional hard mask layer 286 is removed, such as by etching. FIG. 44 is a view of a fifth step 296 of an alternate spring probe assembly coating process, in which the exposed portion of the protective coating layer 233 is removed, such as by ion milling. FIG. 45 is a view of an optional sixth step 298 of an alternate spring probe assembly coating process, in which remaining coating layer 294 may be removed from the probe spring tips 24 of the coated spring probe assembly 16. However, in many embodiments of the alternate spring probe assembly coating process, the fifth step 296, which is preferably provided by ion-milling, is sufficient to remove the coating layer 294 as well.

FIG. 46 is a view of a seventh step 300 of an alternate spring probe assembly coating process, in which the remaining hard mask 286 is stripped from the probe spring tips 24 of the coated spring probe assembly, thereby exposing the protective coating 233.

The alternate non-planar probe spring coating process therefore provides a protective coating 233 to the tips 24 of the probe springs, while etching the unwanted applied protective coating 233 in the substrate surface 16 and portions of the spring probes 61 which are not coated with coating layer 294.

Spring Probe Substrates for Ultra High Frequency Applications. As described above, the structure of the probe card assemblies 60 provides very short electrical distances between the probe tips 61a–61n and the controlled impedance environment in the printed wiring board probe card 68, which allows the probe card assemblies 60 to be used for high frequency applications. As well, the spring probe substrate 16 may preferably be modified for ultra high frequency applications.

Figure 47A:
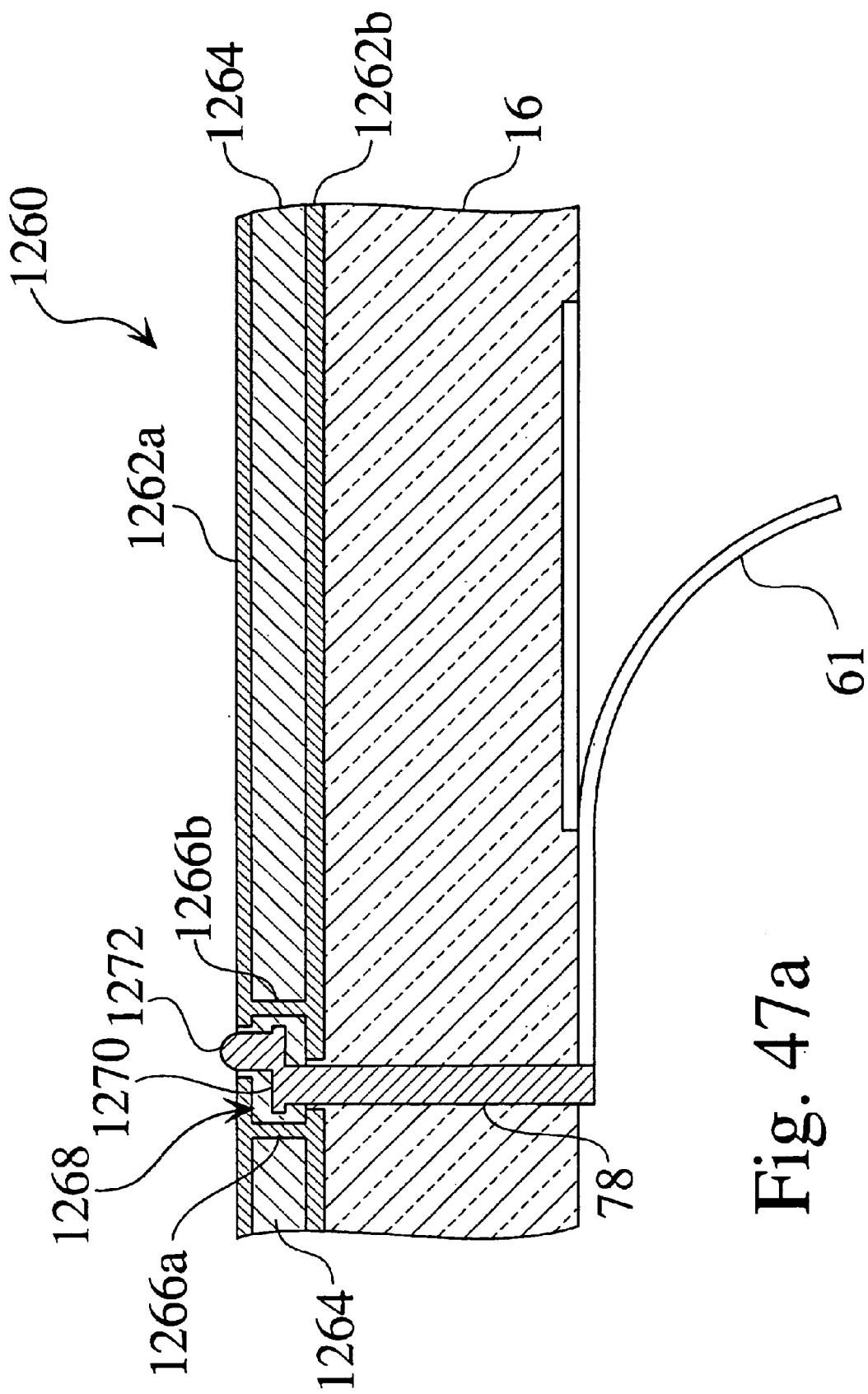
FIGS. 47a and 47b show partial cross-sectional views of reference plane layered spring probe substrates.

FIG. 47a shows a partial cross-sectional view 1260 of an ultra high frequency spring probe substrate 16. For embodiments wherein the traces on one or both surfaces 62a,62b of the substrate 16 are required to be impedance controlled, one or more conductive reference planes 1262a, 1262b may be added within the substrate 16, either on top of the traces 1270, below the traces 1270, or both above and below the traces 1270. The substrate 16 may also contain alternating ground reference traces 1266a, 1266b, which are connected to the one or two reference planes 1262a, 1262b, to effectively provide a shielded coaxial transmission line environment 1268. While the spring probe substrate 16 is typically a ceramic material, the layer 1264 between reference planes is typically a dielectric material.

Figure 47B:
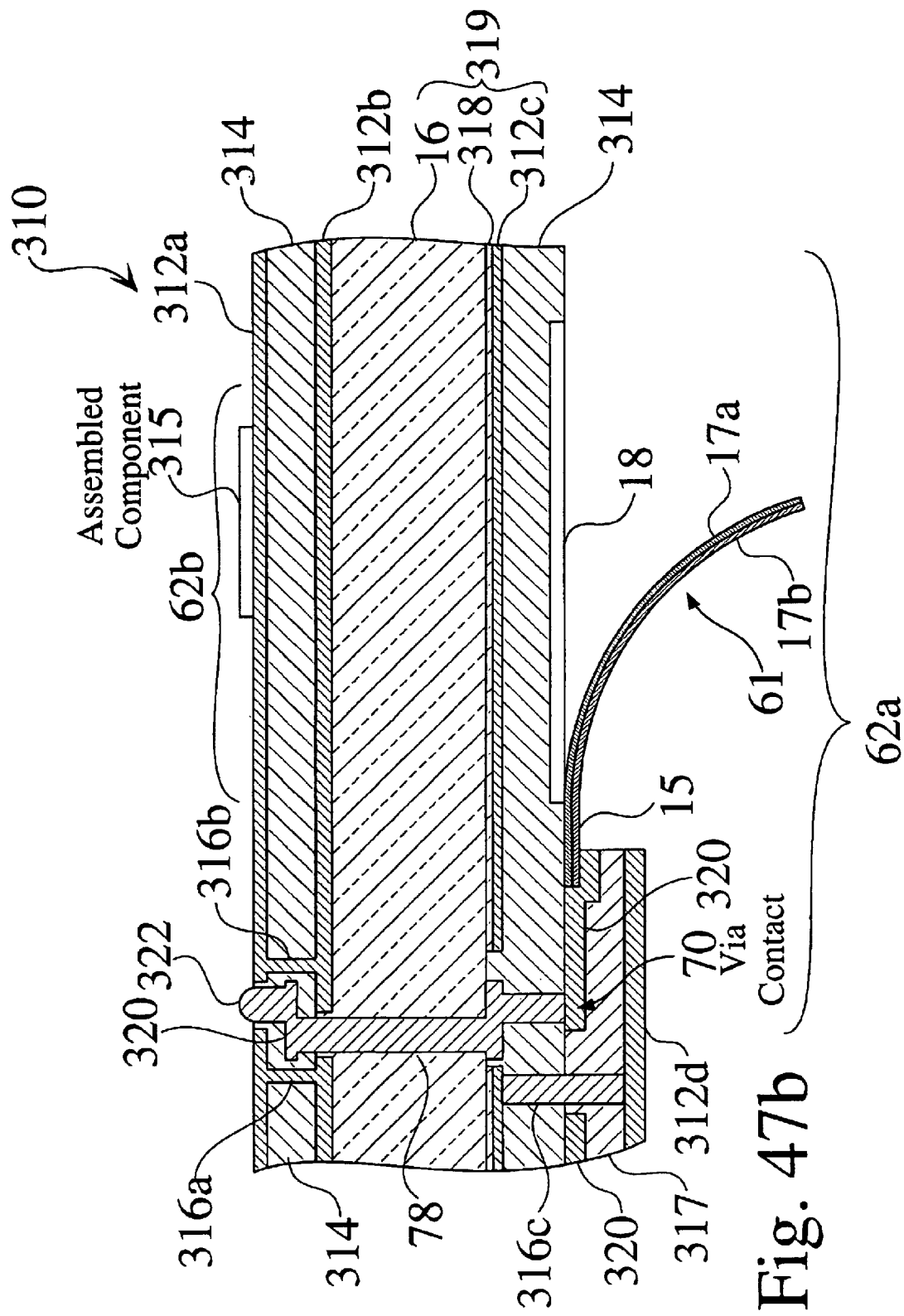

FIG. 47b shows a partial cross-sectional view 310 of an ultra high frequency spring probe substrate 16. For embodiments wherein a spring probe 61 and related electrical conductors 320, 78, 322 on and through the substrate 16 are required to be impedance matched, one or more conductive reference surfaces 312a,312b,312c,312d and vias 316a, 316b,316c may preferably be added, either within or on the substrate 16. As well, the impedance control surfaces 312a, 312b,312c,312d are not limited to the planar surfaces shown in FIG. 47.

A conductive layer 312d may be deposited on top of the insulating layer 317, to provide a coaxial, controlled low impedance connection. Alternate layers of conductive materials 312 and dielectric materials 314 can preferably be integrated within the substrate 16, such as for embodiments which require decoupling capacitors in close proximity to a probe spring 61. For a substrate 16 which is a conductive material, such as silicon, a thin oxide layer 318 may preferably be deposited between the substrate 16 and a conductive reference plane 312c, thereby forming a high capacitance structure 319 between the spring probe 61 and the ground planes 312a and 312b. As well, one or more assembled components 315, such as passive components 315 (e.g. typically capacitors, resistors, and/or inductors), or active component devices 315, may be incorporated on either surface 62a,62b of the substrate 16.

The fixed portions 15 of the spring probes 61 typically extend a relatively short distance across the substrate 16. Traces 60 located on the surface of the substrate 16 are electrically connected to the fixed portions 15 of the spring probes 61, and electrically connect the probe springs 61 to the vias 78. The traces may be comprised of a different material than the spring probes 61, and are preferably comprised of metals having high electrical conductivity (e.g. such as copper or gold).

Although the disclosed probe card assembly systems and improved non-planar spring probes and methods for production are described herein in connection with integrated circuit test probes, and probe cards, the system and techniques can be implemented with other devices, such as interconnections between integrated circuits and substrates within electronic components or devices, burn-in devices and MEMS devices, or any combination thereof, as desired.

Accordingly, although the invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. An apparatus, comprising:
    a daughter printed wiring board having a bottom surface and a top surface, and a plurality of electrical conductors extending from the bottom surface to the top surface; and
    a substrate having a probe surface and a connector surface, the probe surface having a plurality of spring probe contacts, the spring probe contacts comprising at least two metal layers, the geometry of the spring probe formed by different levels of stress between the at least two metal layers, the connector surface having a plurality of electrically conductive pads, a plurality of electrical connectors between each of the plurality of said spring probe contacts and each of the plurality of electrically conductive pads, and a plurality of electrical connections between the plurality of electrically conductive pads and the plurality of electrical conductors on the bottom surface of the daughter printed wiring board; and
    a connector comprising a plurality of electrical connections to the plurality of electrical conductors on the upper surface of the daughter printed wiring board, wherein the connector is a separable connector comprising a first connector half and a second connector half, the first connector half and the second connector half forming a removable mating connection between a plurality of electrical connections on the first half and a plurality of electrical connections on the second half, the plurality of electrical connections on the connector half connected to the each of the plurality of electrical conductors on the upper surface of the daughter printed wiring board.

2. The apparatus of claim 1, wherein the separable connector is an area array connector.

3. An apparatus, comprising:
    a daughter printed wiring board having a bottom surface and a top surface, and a plurality of electrical conductors extending from the bottom surface to the top surfaces; and
    a substrate having a probe surface and a connector surface, the probe surface having a plurality of spring probe contacts, the spring probe contacts comprising at least two metal layers, the geometry of the spring probe contacts formed by different levels of stress between the at least two metal layers, the connector surface having a plurality of electrical conductive pads, a plurality of electrical connectors between each of the plurality of said spring probe contacts and each of the plurality of electrical conductive pads, and a plurality of electrical connections between the plurality of electrically conductive pads and the plurality of electrical conductors on the bottom surface of the daughter printed wiring board;
    a connector comprising a plurality of electrical connections to the plurality of electrical conductors on the upper surface of the daughter printed wiring board;
    a probe card substrate having a top surface and a bottom surface, and a plurality of electrical conductors extending from the top surface to the bottom surface, the plurality of electrical conductors on the bottom surface of the probe card substrate in electrical contact with the plurality of electrical connections on the connector; and
    a mechanical connection between the daughter printed wiring board and the probe card substrate;
    wherein the connector is a separable connector comprising a first connector half and a second connector half, the first connector half and the second connector half forming a removable mating connection between a plurality of electrical connections on the first half and a plurality of electrical connections on the second half, the plurality of electrical connections on the first connector half connected to each of the plurality of electrical conductors on the upper surface of the daughter printed wiring board, and the plurality of electrical connections on the second connector half connected to each of the electrical conductors on the probe card substrate.

4. The apparatus of claim 3, wherein the separable connector is an area array connector.

* * * * *